(12) United States Patent
Yang

(10) Patent No.: US 10,446,437 B2
(45) Date of Patent: Oct. 15, 2019

(54) INTERLEVEL CONNECTORS IN MULTILEVEL CIRCUITRY, AND METHOD FOR FORMING THE SAME

(71) Applicant: MACRONIX INTERNATIONAL CO., LTD., Hsinchu (TW)

(72) Inventor: Chin-Cheng Yang, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 57 days.

(21) Appl. No.: 15/289,231

(22) Filed: Oct. 10, 2016

(65) Prior Publication Data
US 2018/0102281 A1    Apr. 12, 2018

(51) Int. Cl.
*H01L 23/498* (2006.01)
*H01L 21/768* (2006.01)
(Continued)

(52) U.S. Cl.
CPC ........ *H01L 21/76816* (2013.01); *G11C 16/08* (2013.01); *H01L 21/76877* (2013.01); *H01L 23/5226* (2013.01); *H01L 23/5283* (2013.01); *H01L 27/1157* (2013.01); *H01L 27/11524* (2013.01); *H01L 27/11529* (2013.01); *H01L 27/11548* (2013.01); *H01L 27/11556* (2013.01); *H01L 27/11573* (2013.01);
(Continued)

(58) Field of Classification Search
CPC ........... H01L 21/76816; H01L 23/5283; H01L 23/5226; H01L 27/11573; H01L 21/76877; H01L 27/1157; H01L 27/11529; H01L 27/11556; H01L 27/11524; H01L 27/11582; G11C 16/08
See application file for complete search history.

(56) References Cited

U.S. PATENT DOCUMENTS 7,081,377 B2    7/2006    Cleeves
8,008,732 B2    8/2011    Kiyotoshi et al.
(Continued)

FOREIGN PATENT DOCUMENTS

EP    2136398 A1    12/2009

OTHER PUBLICATIONS

Johnson, Mark, et al., "512-Mb PROM With a Three-Dimensional Array of Diode/Antifuse Memory Cells," IEEE J. of Solid-State Circuits, vol. 38, No. 11, Nov. 2003, 1920-1928.
(Continued)

*Primary Examiner* — Cuong B Nguyen
(74) *Attorney, Agent, or Firm* — Haynes Beffel & Wolfeld LLP

(57) ABSTRACT

Multilevel circuitry such as a a 3D memory array, has a set of contact regions arranged around a perimeter of a multilevel region, in which connection is made to circuit elements in a number W levels. Each of the contact regions has a number of steps having landing areas thereon, including steps on up to a number M levels, where the number M can be much less than W. A combination of contact regions provides landing areas on all of the W levels, each of the contact regions in the combination having landing areas on different subsets of the W levels. A method of forming the device uses an etch-trim process to form M levels in all of the contact regions, and one or more anisotropic etches in some of the contact regions.

10 Claims, 19 Drawing Sheets

(51) Int. Cl.
  G11C 16/08     (2006.01)
  H01L 23/522    (2006.01)
  H01L 23/528    (2006.01)
  H01L 27/11524  (2017.01)
  H01L 27/11529  (2017.01)
  H01L 27/11556  (2017.01)
  H01L 27/1157   (2017.01)
  H01L 27/11573  (2017.01)
  H01L 27/11582  (2017.01)
  H01L 27/11548  (2017.01)
  H01L 27/11575  (2017.01)
  H01L 27/11526  (2017.01)

(52) U.S. Cl.
  CPC .. *H01L 27/11575* (2013.01); *H01L 27/11582* (2013.01); *H01L 27/11526* (2013.01)

(56) References Cited

U.S. PATENT DOCUMENTS

| | | | |
|---|---|---|---|
| 8,383,512 | B2 | 2/2013 | Chen et al. |
| 8,598,032 | B2 | 12/2013 | Chen et al. |
| 8,633,099 | B1 | 1/2014 | Shih et al. |
| 8,736,069 | B2 | 5/2014 | Chiu et al. |
| 8,759,217 | B1 * | 6/2014 | Chen ................ H01L 21/76838 438/689 |
| 8,759,899 | B1 | 6/2014 | Lue et al. |
| 8,836,137 | B2 | 9/2014 | Chen |
| 8,928,149 | B2 | 1/2015 | Chen |
| 8,981,567 | B2 | 3/2015 | Hu et al. |
| 9,070,447 | B2 | 3/2015 | Chen |
| 9,048,341 | B2 | 6/2015 | Chen et al. |
| 9,165,823 | B2 | 10/2015 | Chen |
| 9,196,628 | B1 | 11/2015 | Chen |
| 2012/0119287 | A1 | 5/2012 | Park et al. |
| 2012/0184097 | A1 * | 7/2012 | Chen ................ H01L 27/11286 438/618 |
| 2012/0306089 | A1 | 12/2012 | Freeman et al. |
| 2013/0095654 | A1 | 4/2013 | Kwon et al. |
| 2014/0027838 | A1 | 1/2014 | Kido et al. |
| 2014/0159127 | A1 | 6/2014 | Lee et al. |
| 2014/0193973 | A1 | 7/2014 | Chen |
| 2014/0264925 | A1 | 9/2014 | Chen |
| 2014/0284675 | A1 | 9/2014 | Watanabe |
| 2015/0001613 | A1 | 1/2015 | Yip et al. |
| 2015/0214107 | A1 | 7/2015 | Freeman et al. |

OTHER PUBLICATIONS

Jung et al., "Three Dimensionally Stacked NAND Flash Memory Technology Using Stacking Single Crystal Si Layers on ILD and TANOS Structure for Beyond 30nm Node," IEEE IEDM, Dec. 11-13, 2006, 4 pages.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai, Erh-Kun, et al., "A Multi-Layer Stackable Thin-Film Transistor (TFT) NAND-Type Flash Memory," Electron Devices Meeting, IEDM 2006, Int'l Dec. 11-13, 2006, 4 pages.

Tanaka H., et al., "Bit Cost Scalable Technology with Punch and Plug Process for Ultra High Density Flash Memory," 2007 Symp. VLSI Tech., Digest of Tech. Papers, pp. 14-15.

European Search Report in 16199764.8 dated Dec. 6, 2017, 12 pages.

Taiwan Office Action dated Oct. 26, 2017, 7 pages.

* cited by examiner

FIG. 4A  PHO pattern

FIG. 4B  Etch 9 layers

INTERLEVEL CONNECTORS IN MULTILEVEL CIRCUITRY, AND METHOD FOR FORMING THE SAME

BACKGROUND OF THE INVENTION

Field of the Invention

The present invention relates generally to high density integrated circuit devices, and more particularly to methods for forming interlevel connectors for multilevel three-dimensional devices.

Description of Related Art

In the manufacturing of memory devices, the amount of data per unit area on an integrated circuit can be a critical factor. Thus, as the critical dimensions of the memory devices approach lithographic technology limits, techniques for stacking multiple levels of memory cells have been proposed in order to achieve greater storage density and lower costs per bit.

For example, thin film transistor techniques are applied to charge trapping memory in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells," IEEE J. of Solid-State Circuits, Vol. 38, No. 11, November 2003. See, also U.S. Pat. No. 7,081,377 to Cleeves entitled "Three-Dimensional Memory."

Another structure that provides vertical NAND cells in a charge trapping memory technology is described in "Novel 3D Structure for Ultra-High Density Flash Memory with VRAT and PIPE," by Kim et al., 2008 Symposium on VLSI Technology Digest of Technical Papers;" 17-19 Jun. 2008; pages 122-123.

In three-dimensional (3D) stacked memory devices, conductive interconnects used to couple the lower levels of memory cells to peripheral circuits, like decoders, drivers and the like, pass through the upper layers. Stairstep structures have been formed to accommodate the interconnects, so that vertical interlevel connections can be made to landing areas on each level of the circuitry, the vertical interconnections extending to a plane over the top level of the stack for routing to the peripheral circuits by patterned conductors in metal layers.

One approach to reduce the number of lithographic steps used to make stairstep structures is described in Tanaka et al., "Bit Cost Scalable Technology with Punch and Plug Process for Ultra High Density Flash Memory," 2007 Symposium on VLSI Technology Digest of Technical Papers; 12-14 Jun. 2007; pages 14-15. Tanaka describes a mask, etch, trim sequence in FIG. 8, for example.

Other technologies are described in U.S. Pat. No. 8,598,032 issued on 3 Dec. 2013, entitled REDUCED NUMBER OF MASK FOR IC DEVICE WITH STACKED CONTACT LEVELS; U.S. Pat. No. 8,383,512 issued on 26 Feb. 2013, entitled METHOD FOR MAKING MULTILAYER CONNECTION STRUCTURE; U.S. Pat. No. 8,836,137 issued on 16 Sep. 2014, entitled METHOD FOR CREATING A 3D STACKED MULTICHIP MODULE; U.S. Pat. No. 9,048,341 issued on 2 Jun. 2015, entitled INTEGRATED CIRCUIT CAPACITOR AND METHOD; U.S. Pat. No. 8,633,099 issued on 21 Jan. 2014, entitled METHOD FOR FORMING INTERLEVEL CONNECTORS IN A THREE-DIMENSIONAL STACKED IC DEVICE; and U.S. Pat. No. 8,736,069 issued on 27 May 2014, entitled MULTI-LEVEL VERTICAL PLUG FORMATION WITH STOP LAYERS OF INCREASING THICKNESSES, the disclosures of which are incorporated by reference.

However, drawbacks with contact structures for 3D stacked memory devices, and other 3D circuit structures, include a high number of lithographic and etch mask steps required, and a relatively large area in layout required. Both of these problems increase costs and reduce density of the circuits. These drawbacks become more and more difficult as the number of levels increases for high density circuits.

It is desirable to provide a technology that can limit the number of photolithographic masks required and the amount of area consumed for contact structures including interlevel connectors, particularly for 3D devices with a large number of levels.

SUMMARY OF THE DISCLOSURE

A device is described including multilevel circuitry with interlevel connectors arranged on the boundary of a core region of the multilevel circuitry. The multilevel circuitry includes a 3D multilevel region, such as a region including a 3D memory array, and a set of contact regions arranged around a perimeter of the multilevel region, in which connection is made to circuit elements in the multiple levels. The circuit elements in the contact regions can be conductors connected to word lines, bit lines or other circuit elements in a multilevel circuitry. The multilevel region can be characterized as having a number W levels to which contact is to be made, with interlevel connectors in the contact regions contacting landing areas on each level. Each of the contact regions has a number of steps having landing areas thereon, including steps on up to a maximum number M levels, where the number M is equal to a number of steps, such as a number of steps formed using an etch-trim process, and can be much less than W, such as about one half, one fourth or ⅛ of W. A set of contact regions in combination provides landing areas on all of the W levels, and each of the contact regions in the combination can have landing areas on different subsets of the W levels.

A method of forming the device includes using an etch-trim process to form M levels in all of the contact regions, and using one or more anisotropic step etch processes in subsets of the contact regions to form landing areas in different subsets of the set of W levels, where each of the different subsets subsets can have contact regions on up to M levels. The etch-trim process can include more than one etch-trim cycle, each etch-trim cycle using an etch-trim mask. Also, the method can include using more than one anisotropic step etch process, each step etch process using a single step mask exposing all of the M steps in a subset of the contact regions.

The clauses "etch-trim mask" and the term "step mask" are used as labels herein, and do not imply structure. For example, an "etch-trim mask" and a "step mask" can be implemented using the same type of mask material, such as photoresist, or can be implemented using different types of mask material.

Also, a set of etch mask reticles is provided for use in methods described above.

The device described herein can provide for implementation multilevel circuitry in a smaller area, because of the configuration of the contact regions and interlevel connectors requires a reduced area. Also, the device described herein can be made using a smaller number of photomask steps than has been practical using prior art technologies. Furthermore, the technology can be implemented with high reliability, and good process margin.

Other aspects and advantages of the present invention can be seen on review of the drawings, the detailed description, and the claims which follow.

DETAILED DESCRIPTION

Figure 1:
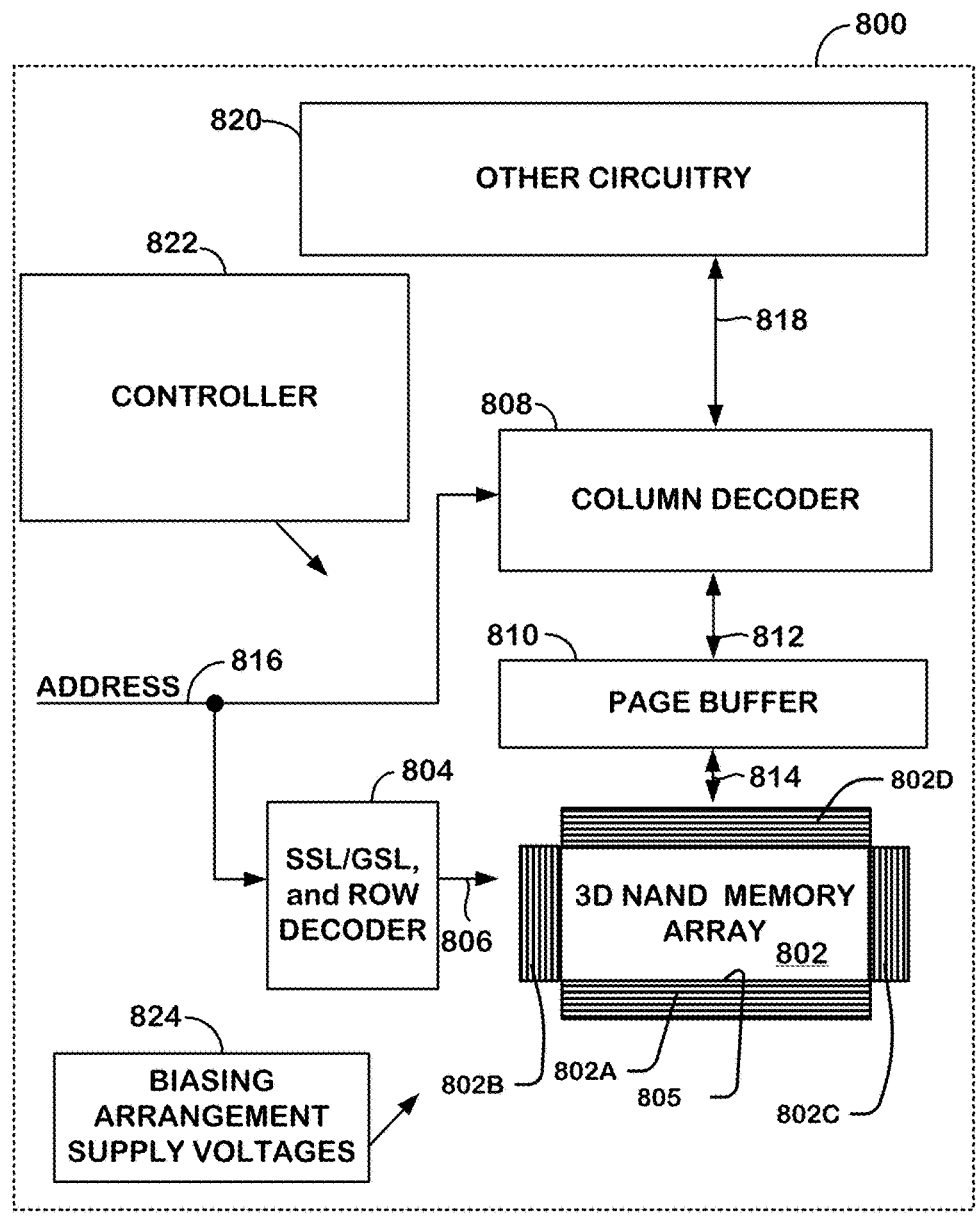
FIG. 1 is a block diagram of an integrated circuit including stairstep contact structures in contact regions on the perimeter of an array area.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a block diagram of an integrated circuit 800 including a 3D NAND memory array 802 having stepped connectors, such as stepped interlevel connectors 64 as described herein, to the bit lines or word lines, or both. A 3D NAND memory array 802 can include multiple levels of cells arranged in multiple NAND strings. A decoder 804 is coupled to a plurality of word lines 806 arranged along rows in the 3D NAND memory array 802 and to the SSL and GSL lines for selecting cells and NAND strings in the array. Decoder 808 is coupled to a set of page buffers 810, in this example via data bus 812. The global bit lines 814 are coupled to local bit lines in the 3D NAND memory array 802. Addresses are supplied on bus 816 to decoder block 808 and decoder 804. Data is supplied via the data-in line 818 from other circuitry 820 (including for example input/output ports) on the integrated circuit, such as a general purpose processor or special purpose application circuitry, or a combination of modules providing system-on-a-chip functionality supported by the 3D NAND memory array 802. Data is supplied via the data-in line 818 to input/output ports or to other data destinations internal or external to the integrated circuit 800.

A controller 822, implemented for example as a state machine, provides signals to control the various components of integrated circuit 800. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The integrated circuit 800 includes 3D NAND memory array 802 and interlevel contact structures in contact regions 802A through 802D, which are one example in which multilevel circuitry having circuit elements disposed in a set of levels including a number W members. The multilevel circuitry has a multilevel region, which can be referred to as the array region, having a rectangular perimeter 805 in this example with four sides. The contact regions 802A through 802D are disposed around the perimeter of the multilevel region. In a compact arrangement, the contact regions have sides co-located on the sides of the perimeter.

The perimeter 805 overlies a transition region between circuit elements in the multilevel region and the interlevel contact structures in the contact regions 802A through 802D. The location of the perimeter can be defined by the masks used in formation of the contact regions, and overlies the transition region in the multilevel circuitry. The circuit elements within the transition region comprise horizontal conductors which connect to the active multilevel circuitry, in this example circuit elements such as word lines, bit lines, source lines and the like in the memory array, to the interlevel connectors in the contact regions. In some examples, the horizontal conductors are patterned lines which can have very high density, or broader conductor structures which may be plate-shaped for example.

As described in more detail below, the interlevel contact structures in the contact regions include in combination landing areas on each of the W levels, while each contact region includes landing areas on a subset of the W levels. The steps within each contact region are sequential, with the landing area on one step corresponding to level (i) and the landing level on the next step in the sequence corresponding to the next lower level (i−1) not counting any levels in the circuitry to which no contact is made in the set of contact regions, as the sequence progresses away from the perimeter of the multilevel region.

For example, in a device in which the 3D NAND memory array 802 has W levels, and four contact regions, one fourth of the steps of the stairstep structure used for making interlevel connections to the W levels can be disposed in each of the four contact regions. Other combinations of contact regions and the number of steps in each can be implemented as described herein. As result of the technology described herein, the area required to implement the contact regions for the multilevel circuit structure is reduced, and the number of lithographic steps required can be minimized. The structure can be reliably manufactured.

Other integrated circuits can include 3D circuitry other than memory circuits, with which the contact structures described herein can be deployed.

Figure 2:
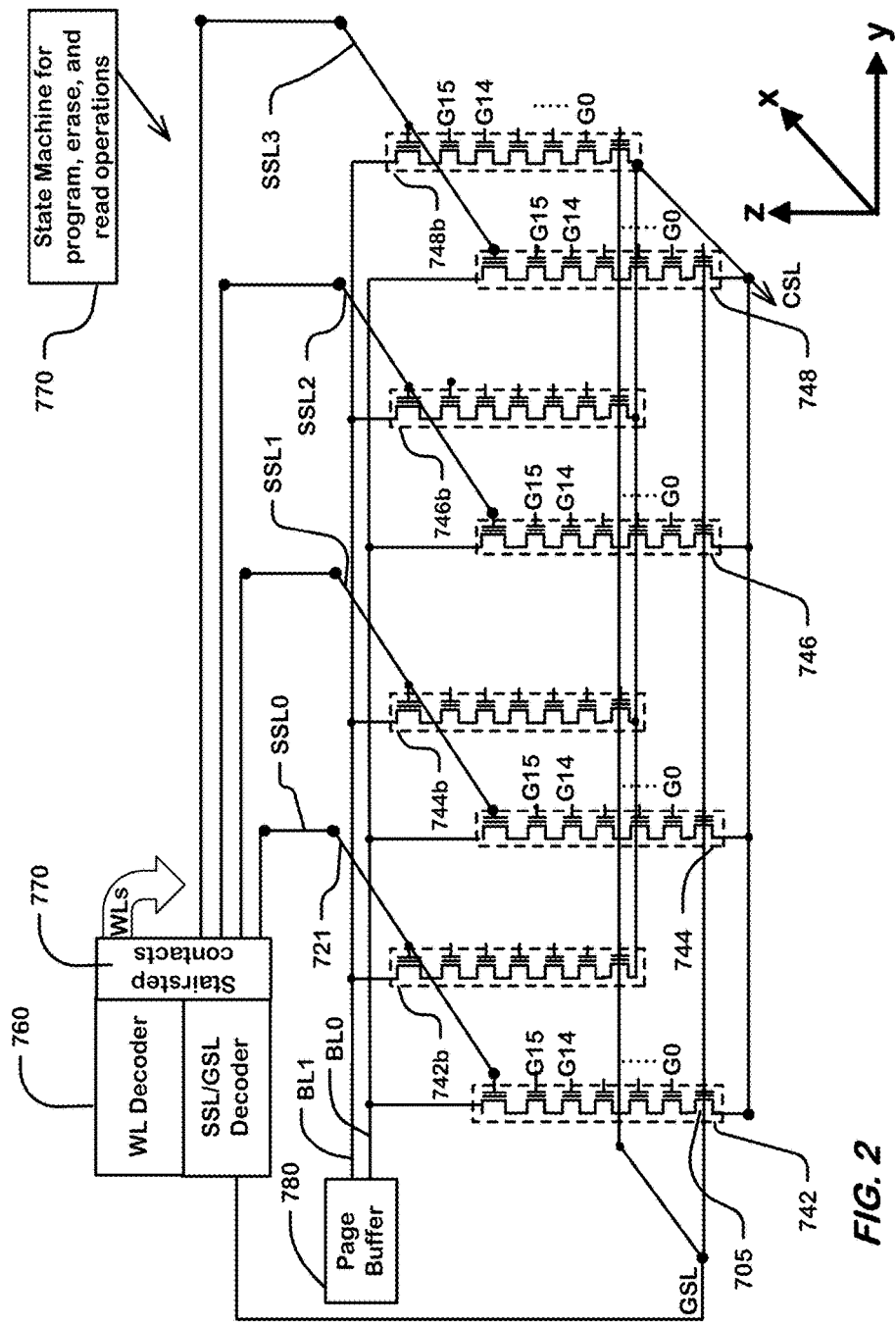
FIG. 2 illustrates a 3D memory structure with multiple levels in a schematic format which can be coupled with the stairstep contact structures as described herein.

FIG. 2 is a circuit diagram illustrating a multilevel circuit structure used to implement a 3D array suitable for use in the device described with reference to FIG. 1. NAND strings of memory cells shown in FIG. 2 are representative of a plurality of NAND strings of memory cells in the memory device. Two NAND strings of memory cells (e.g. 742 and 742b, 744 and 744b, 746 and 746b, 748 and 748b) are shown for each stack, which are representative of multiple NAND strings in a stack. NAND strings are connected to respective bit lines (e.g. BL0, BL1) at upper ends of the stacks.

As shown in the example of FIG. 2, a first NAND string 742 includes circuit elements disposed in multiple levels, including a upper SSL strip 721 configured as a string select line SSL0 in an upper level, intermediate strips configured as word lines (e.g. G15, G14, . . . G0) in intermediate levels, and a bottom strip 705 configured as a ground select line GSL in lower levels, disposed below the intermediate strips. In some embodiments, dummy word lines can be implemented on separate levels of the stack. In this example, there are only 16 word line levels with an SSL level and a GSL level for a total of 16 levels of circuit elements. In other implementations, there can be many more levels, such as 39 levels or 60 levels as used in examples describe below, and other amounts as required according to a particular implementation.

As shown in the example of FIG. 2, a common source line CSL is disposed beneath the multilevel structure. The bottom GSL strip 705 controls a GSL switch at the bottom of each string for connection to the common source line CSL. Bit lines, BL0 and BL1 in this illustrated example, are coupled to the strings at the top of each string of cells. The upper SSL strip 721 controls an SSL switch at the top of each string.

Some peripheral circuits are shown in FIG. 2. The multilevel circuit elements in the array are coupled to the peripheral circuits, which may be implemented in a single layer circuit, or a multilevel circuit located outside the multilevel region in which the array is implemented. In this example, the peripheral circuits include a page buffer 780 which is coupled to the bit lines BL0, BL1. Also, the peripheral circuits include a word line and SSL/GSL decoder 760 coupled to stairstep contacts 770 which in turn connect to the strips configured as word lines, the SSL lines, and the GSL line in the multilevel circuit structure using technology as described herein. The peripheral circuits also include a state machine for example, used to control program, erase and read operations in the multilevel circuit.

Thus, referring to FIG. 2, circuit elements of the multilevel structure coupled to the word lines for example, extend into a contact region on the perimeter of the multilevel region of the device. Stairstep structures are used for connecting the circuit elements in the contact region to overlying patterned connectors which connect to the peripheral circuits.

As mentioned above, the multilevel structure in a given integrated circuit can include a variety of different types of memory structures, logic structures, or other circuitry elements. Stairstep structures for making contact between the multilevel structure and other circuit features can be implemented as described herein.

FIGS. 3A-3D are simplified drawings used to describe basic steps used in an etch-trim cycle as can be used in examples of the technology described herein. The figures show a multilevel circuit structure on an integrated circuit including a stack 10 of conductive layers 12 interleaved with dielectric layers 14. The specific conductive layers and dielectric layers are identified as conductive layers 12.1, 12.2, 12.3 and as dielectric layers 14.1, 14.2, 14.3. Each of the conductive layers includes a circuit element in a particular level of the structure, the illustrated circuit element being a horizontal conductor extending to other circuit elements (not shown). In this example, each level includes a conductive layer (e.g. 12.2) and a dielectric layer (e.g. 14.2) that underlies the conductive layer. In alternative embodiments, each level includes a dielectric layer and a conductive layer that underlies the dielectric layer. In such alternatives, the etching chemistry is chose to stop on the dielectric layer in each level, rather than on the conductive layer.

Figure 3:
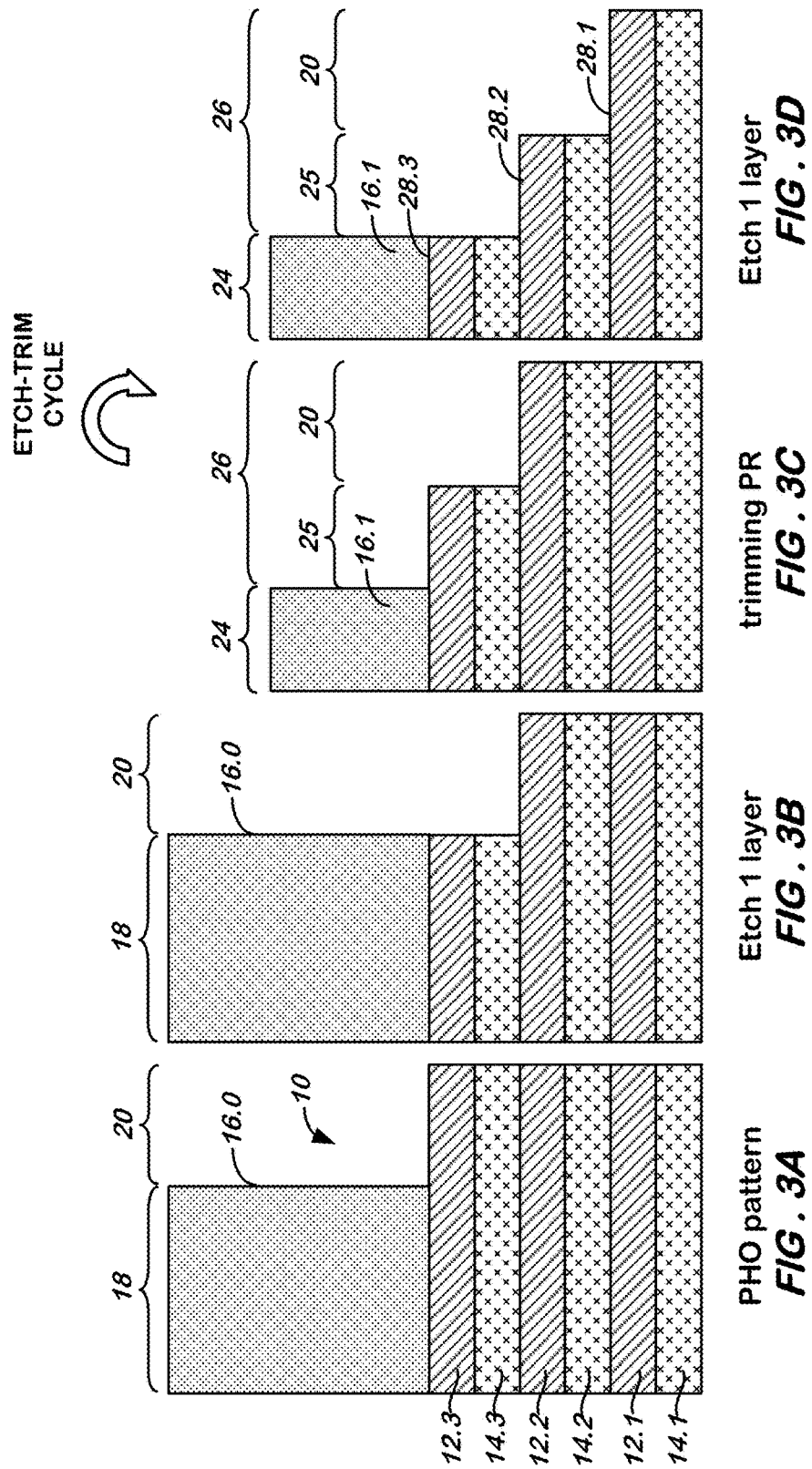
FIGS. 3A, 3B, 3C and 3D are a set of simplified drawings illustrating an "etch-trim cycle" known in the prior art, in which a stack of conductive layers are separated by dielectric layers, etching one level, trimming the etch mask, and etching one level to create the structure of FIG. 3D.

The etching of stack 10 of conductive layers 12 and dielectric layers 14 exposes landing areas 28.1, 28.2, 28.3 using an etch-trim mask. FIG. 3A shows the etch-trim mask 16.0 including a mask region 18 and an open etch region 20. With etch-trim mask 16.0, one level is etched using the first etch mask. FIG. 3B shows the result of etching one level through top conductive layer 12.3 and dielectric layer 14.3 at the open etch region 20 stopping at second conductive layer 12.3. FIG. 3C shows the result of trimming the first etch-trim mask 16.0 of FIG. 3B creating a trimmed first etch-trim mask 16.1 having a trimmed mask region 24, a new open etch region 25, and an expanded open etch region 26, region 26 being equal to region 20 plus region 25. FIG. 3D shows the result of etching one level of the structure of FIG. 3C at expanded open etch region 26. The resulting structure has exposed conductive landing areas 28, identified as areas 28.1, 28.2 and 28.3. Area 28.3 is considered exposed because it will be exposed upon removal of trimmed etch mask 22.

FIGS. 3A-3D show a two-step etch-trim cycle for forming a stairstep structure having sequential landing areas on three levels. As described herein, one etch-trim cycle using a single starting mask (e.g. mask 16.0) can be used to form more than two steps, including for example 4, 5, 6, 8 or any number of steps.

In order to use one etch-trim cycle to form a larger number of steps, the starting mask must be thicker to accommodate the erosion of the mask during each of the trim cycles. In order to use a thicker mask, in some technologies the dimensions of the contact regions must be relatively large to maintain the accuracy of the lithographic steps. Denser masks, with periodic openings having small dimensions in between, must be relatively thin, and can therefore only accommodate a small number of trim cycles. In examples of the present technology, a single etch-trim cycle using one mask can be used to form for example 6 to 10 steps.

Also, an etch-trim process including multiple etch-trim cycles can be used to form a larger number of steps using one starting mask per cycle. For example, one starting mask can be used to form eight steps with seven trim cycles, and a second starting mask can be used to form eight additional steps for a total of 16 stairsteps arranged sequentially.

The etch-trim masks 16.1, 16.2 can be implemented using photoresist. Trimming processes for a photoresist mask are normally isotropic or multi-directional. This results in loss of the photoresist mask in the X, Y and Z directions. The loss in the Z direction can limit the number of levels to be etched in a given etch-trim cycle.

As seen in FIG. 3D, the contact regions include circuit elements comprising a conductor formed of the conductive material in each level extending as connectors into the contact regions from other circuit elements in the corresponding levels.

Figure 4:
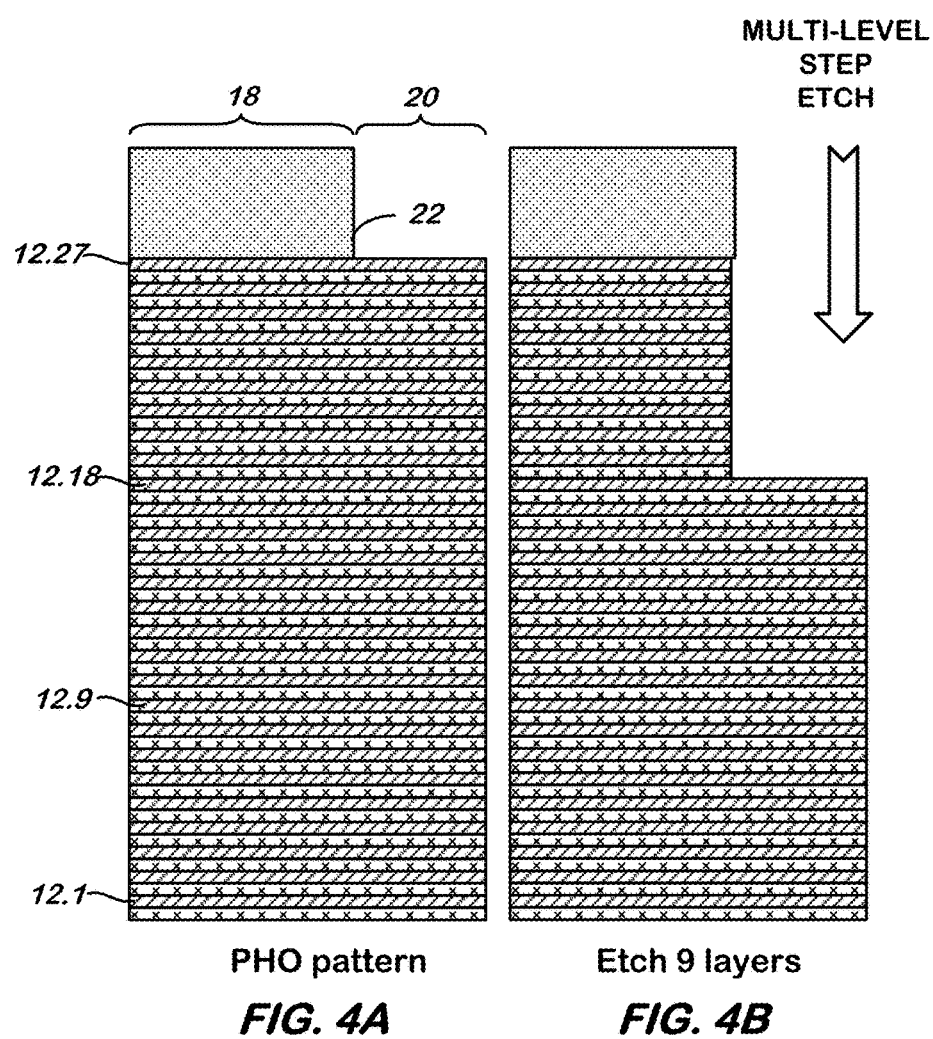
FIGS. 4A-4B are a set of simplified drawing figures illustrating a multilevel "step etch" known in the prior art.

FIGS. 4A-4B show process steps using a step mask 22 to etch multiple levels of the structure in a multilevel etch using anisotropic etching so that relatively straight or vertical sidewalls are formed in the opening of the step mask, continuing with the example in which the conductive layer is on top of the dielectric layer in each level, rather than vice versa. FIG. 4B shows the results of a multilevel step etching through 9 levels starting with the top layer 12.27 to expose conductive layer 12.18. In the multilevel etch, the single step mask 22 defines the location of the edge of the etch of multiple layers so that all the layers are relatively aligned, within processing margins. The procedure can involve using a sequence of etch chemistries, designed for anisotropic etching of the conductive layer stopping on the dielectric layer, and then an etch chemistry designed for anisotropic etching of the dielectric layer stopping on the conductive layer, and so on, for the number of levels desired to be etched. Other techniques can involve for example a timed etch chemistry which can remove both types of layers, stopping before the desired level is reached, and then changing to such chemistries which are selective, and can stop on a specific layer.

Figure 5:
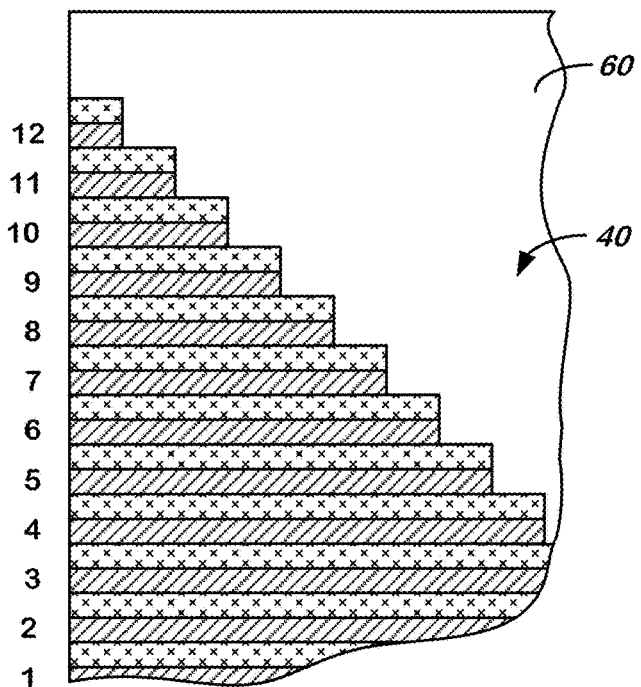
FIG. 5 illustrates dielectric material covering the landing areas of a portion of a processed stack.
Figure 6:
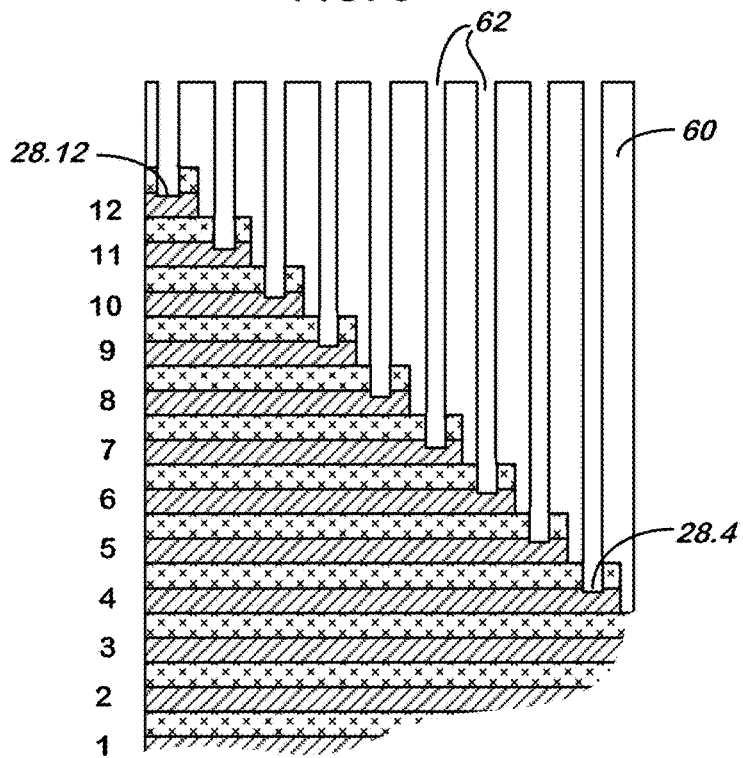
FIG. 6 shows the structure of FIG. 5 with contact openings formed through the dielectric material down to the landing areas.
Figure 7:
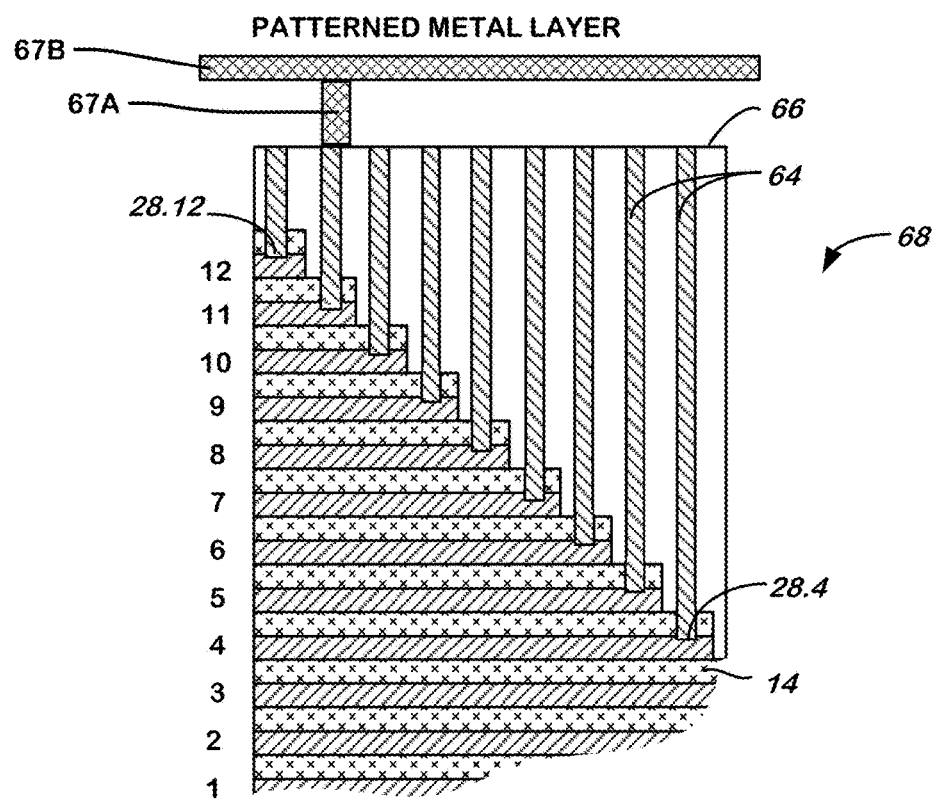
FIG. 7 illustrates the structure of FIG. 6 after the contact openings have been filled with an electrically conductive material forming interlevel connectors contacting the landing areas.

One technique for forming interlevel connectors, which contact the landing areas on the steps of the stairstep structures can be understood with reference to FIGS. 5-7. In FIGS. 5-7, each level has a dielectric layer on top of a conductive layer. After applying the etching processes to form the stairstep structures, the landing areas of the stairstep stack can be covered by a dielectric fill material 60 such as common silicon oxide based materials. FIG. 5 illustrates a portion of a processed stack 40 with a dielectric material 60 covering landing areas 28 on the conductive layer in the levels. Dielectric fill material 60 may be the same material as dielectric layers 14 or a different material. FIG. 6 shows contact openings 62, which can be formed by a patterned contact hole etching process, to extend down to landing areas 28. As shown in FIG. 7, the contact openings 62 are then filled with a conductive material extending to contact landing areas 28 to create interlevel connectors 64. A planarizing process, such as chemical mechanical polishing, can be used to create the planarized surface 66 of the three-dimensional stairstep structure 68 shown in FIG. 7. The resulting contact surfaces at the surface 66 are used for connection to patterned conductors (e.g. 67A, 67B) above the contact regions by which connection to the peripheral circuits is made. Further information on similar techniques and methods for creating contact openings 62 are disclosed in U.S. Pat. Nos. 8,598,032, 8,383,512, 8,836,137 and 9,048,341, referenced above.

Conductive layers 12 can be electrically conductive semiconductors including heavily doped polysilicon (using dopants such as As, P, B), silicides including TiSi, CoSi, oxide semiconductors, including InZnO, InGaZnO, and combinations of semiconductors and silicides. Conductive layers 12 can also be a metal, a conductive compound, or combinations of materials including Al, Cu, W, Ti, Co, Ni, TiN, TaN, TaAlN, and others. Interlevel connectors 64 can be a metal or other electrically conductive materials appropriate for use with the materials used for conductive layers 12. Dielectric layers 14 and dielectric fill material 60 can be an oxide, nitride, oxynitride, silicate, or others as appropriate for the manufacturing techniques applied. Low dielectric constant materials having a dielectric constant smaller than that of silicon dioxide, such as $SiCHO_x$, may be preferred. High dielectric constant (high-k) materials having a dielectric constant greater than that of silicon dioxide, such as $HfO_x$, HfON, $AlO_x$, $RuO_x$, $TiO_x$, may be included also.

The present technology can be used with a wide range of integrated circuit devices including, for example, 3D NAND Flash memory. Also, embodiments can be used for devices in which the levels are chips in stacks of chips, using through silicon via (TSV) structure as the interlevel conductors, with conductive layers 12 being separate integrated circuits with landing areas on parts of the conductive layers. Conductive layers 12 can be word lines or bit line connectors on different layers of a 3D array of a 3D memory structure. Conductive layers 12 can be connectors among layers of conductors on an IC package. Conductive layers 12 can be connectors among ICs in a multi-chip module type IC package.

Figure 8A:
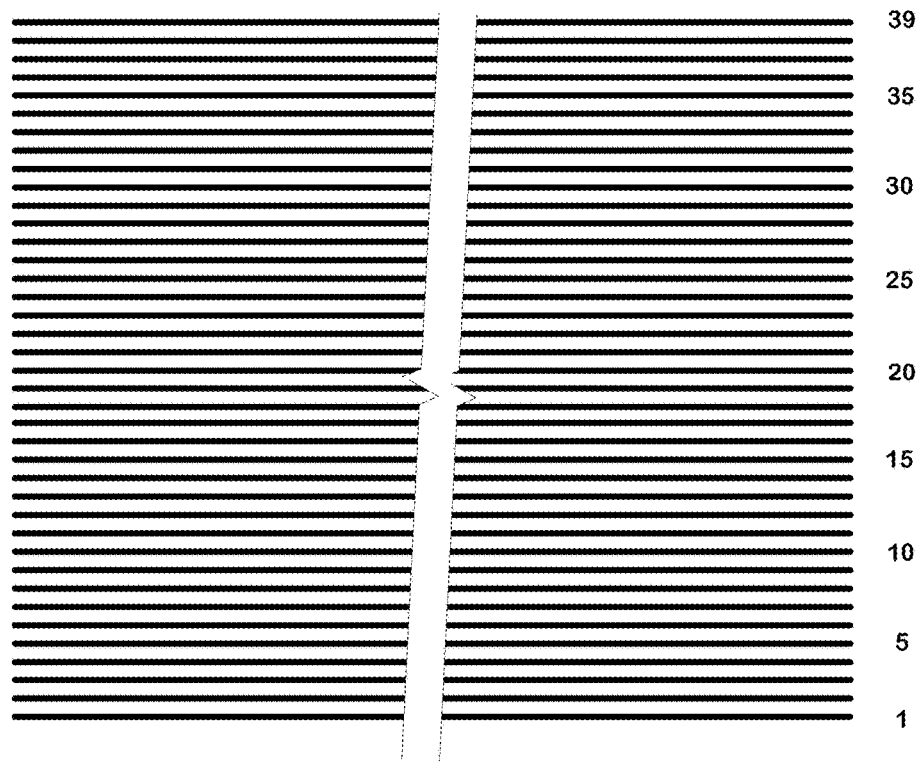
FIG. 8A illustrates in schematic cross-section multilevel circuitry having 39 levels to which present technology can be applied to form interlevel contacts.

Examples of a process for forming the stairstep structures, and the resulting structures, are described starting with reference to FIG. 8A.

FIG. 8A is a schematic cross-section showing, 39 levels of multilevel circuitry. Each level can comprise circuit elements formed using a conductive layer and the dielectric layer, or can be more complex as suits the needs of particular implementation. The levels are numbered from the top level 39 to the lowest level 1. The number 39 is chosen according to the particular multilevel circuitry being implemented. For example, in a 3D NAND array, there can be 32 word line levels, one or more SSL line levels, one or more GSL line levels, and one or more dummy line levels adding up to 39 total levels which require connection to peripheral circuitry via the interlevel connections at the stairstep structures.

Figure 8B:
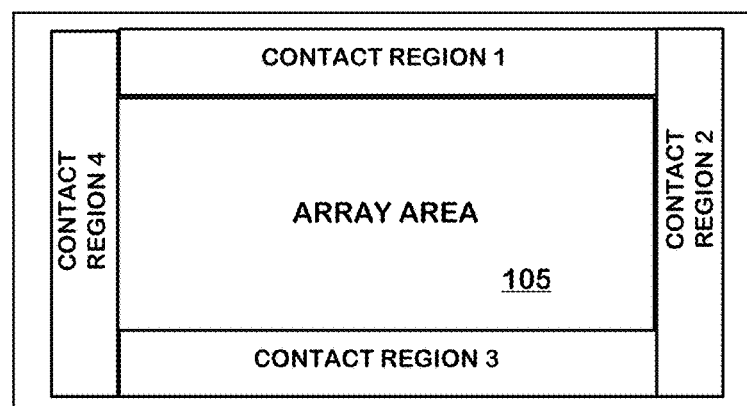
FIG. 8B illustrates a layout arrangement of the multilevel region and contact regions around the perimeter of the multilevel region according to one implementation of the present technology.

FIG. 8B illustrates in plan view, or layout view, the multilevel circuitry 100 having 39 levels. The multilevel circuitry 100 includes an array area 105, and a set of contact regions having four members referred to as contact region 1, contact region 2, contact region 3, and contact region 4. In this example, the members of the set of contact regions are disposed around the perimeter of the array area 105. The sides of the contact regions in the set of contact regions are co-located with the perimeter of the array area 105.

In general, the multilevel circuitry of FIGS. 8A and 8B comprises circuit elements disposed in a set of levels including W members, each designated level L(i) for an index "i" going from 1 to W, where W equals 39 in this example. Also, the multilevel circuitry includes a set of contact regions including N members, disposed around the perimeter of a multilevel region including array area 105. In this example N equals four. The contact regions are disposed on all four sides of a rectangular perimeter in this example. Each of the contact regions has one side co-located with a side of the perimeter.

Figure 9A:
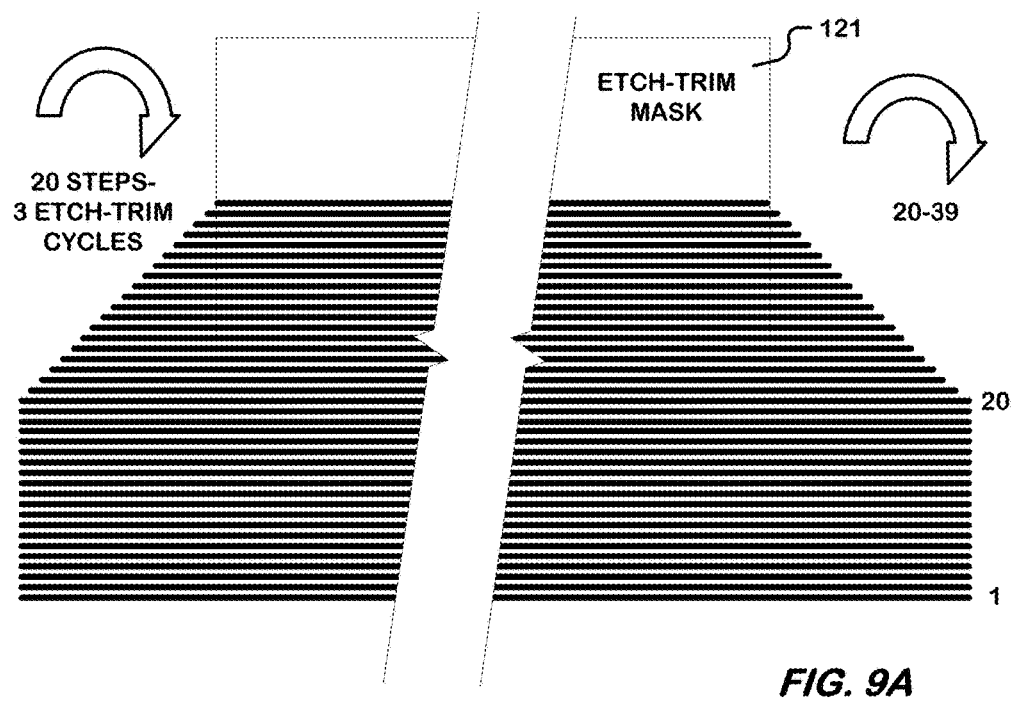
FIG. 9A illustrates in schematic cross-section multilevel circuitry after applying an etch-trim process as described herein.
Figure 9B:
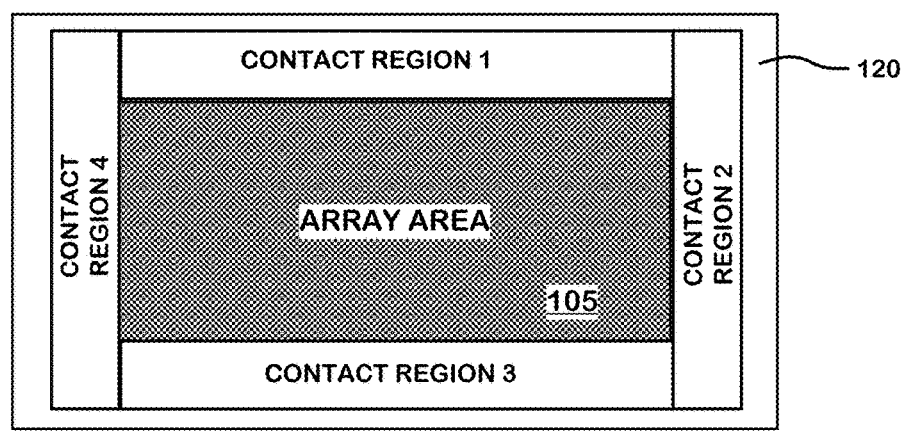
FIG. 9B illustrates a layout arrangement of a mask for the multilevel region and the contact regions used in the etch-trim process for FIG. 9A.

FIG. 9A illustrates the 39 levels after applying an etch-trim process to form 20 sequential steps. FIG. 9B illustrates locations in which the etch-trim process is applied, including all four contact regions, contact region 1 through contact region 4. The array area is protected by masking indicated by the dark hatching in the figure. In one example, a hard mask 120 that can survive the etch-trim processes is disposed around the outside of the contact regions. The trim mask can be disposed over the array area and appropriate parts of the contact regions initially. After the etch-trim process is applied, remaining portion of trim mask 121 is illustrated over the array area after the final etch, before removal at the end of the etching cycle.

The etch-trim process used to form 20 steps in one example can involve three etch-trim cycles. The first etch-trim cycle includes a first photoresist mask configured for creation of eight steps. The first photoresist mask is formed, and trimmed seven times in the process of creating eight steps. The second etch-trim cycle includes a second photoresist mask configured for creation of seven steps in this example. The second photoresist mask is formed, and trimmed six times in the process of creating seven steps. A third etch-trim cycle includes a third photoresist mask configured for creation of the five steps, and trimmed four times. The etch-trim process creates sequential steps with the highest level 39 proximal to the perimeter of the multilevel region, and the lowest level 20 distal to the perimeter.

Thus, the structure of FIG. 9A results from performing an etch-trim process to form M steps, where M equals 20 in this example. The M steps are formed in each of the N members of the set of contact regions including contact region 1 through contact region 4. The etch-trim process includes at least one, and in this example 3 etch-trim cycles. Each etch-trim cycle includes the steps of forming an etch-trim mask exposing portions of the set of contact regions, and covering the multilevel region, and then iteratively etching one level of the set of levels using the etch-trim mask, trimming the etch-trim mask in the set of contact regions, and etching one more level using the trimmed etch-trim mask for a number of iterations. The number of iterations depends on the thickness of the etch-trim mask at the beginning, and the amount of erosion of the etch-trim mask encountered during each step.

Figure 10A:
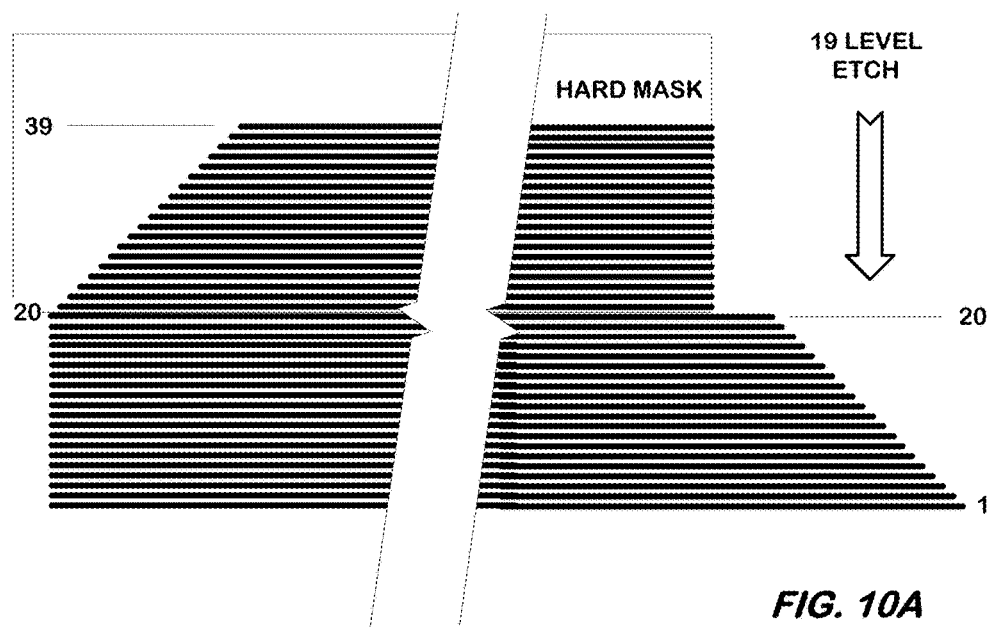
FIG. 10A illustrates in schematic cross-section multilevel circuitry after applying a step etch process as described herein.
Figure 10B:
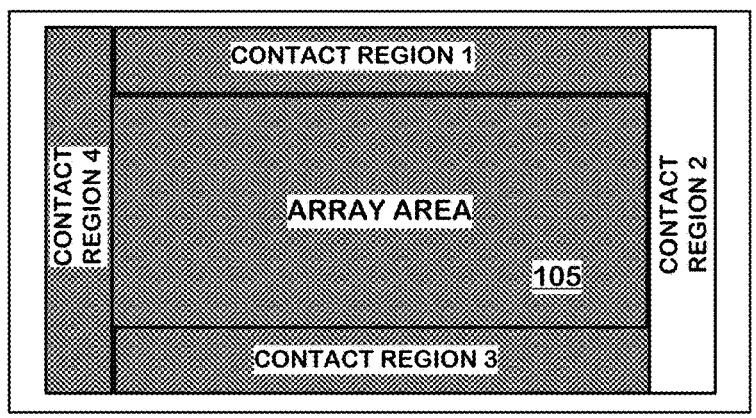
FIG. 10B illustrates a layout arrangement of a mask for the multilevel region and the contact regions used in the step etch process for FIG. 10A.

FIG. 10A illustrates the 39 levels after applying a step mask exposing a subset of the set of contact regions, and anisotropically etching through a number S1 levels, where S1 is equal to 19, in the exposed subset. FIG. 10B illustrates the location of the subset of contact regions in which the deep anisotropic etch is applied, including in this example only contact region 2. The step mask can be a hard mask or a relatively thick photoresist mask, and protects the array area and the other contact regions. The step mask has an open etch area exposing all M steps formed by the etch-trim process in the subset of the set contact regions to which it is applied.

The 19 level anisotropic etch applied in contact region 2 results in a transfer of the stepped pattern from levels 20-39 to levels 1-20. The mask protects the stepped pattern in contact region 1 through contact region 3 leaving steps on levels 20-39. In this combination of steps because M (20 in this example) is greater than S1 (19 in this example), an interlevel connection to a landing area on level 20 can be implemented in either the subset of contact regions exposed to the step etch, or the other contact regions, or both. In embodiments of the technology described herein, to provide landing areas on each level in sequence without skipping levels, M must be equal to or greater than the number (e.g. S1) of levels etched in any of the step etches.

Thus, the structure of FIG. 10A results from performing the deep anisotropic etch, etching through S1 layers using a step mask, where S1 equals 19 in this example. The deep anisotropic etch of S1 levels is applied in a subset of the contact regions, including less than all of the N members of the set of contact regions. Therefore, landing areas on circuit elements in S1+M levels are formed in the set of contact regions. If S1+M is equal to W, the process is finished. In any one contact region in the set of contact regions, landing areas on no more than M levels are formed.

As illustrated in FIG. 10B, may not be necessary to mask the peripheral region around the array area 105 because the etch trim and step etch cycles will remove the layers of material used to form the 3D structure. One process in which no mask is necessary is described with reference to FIG. 10C and FIG. 10D.

Figure 10C:
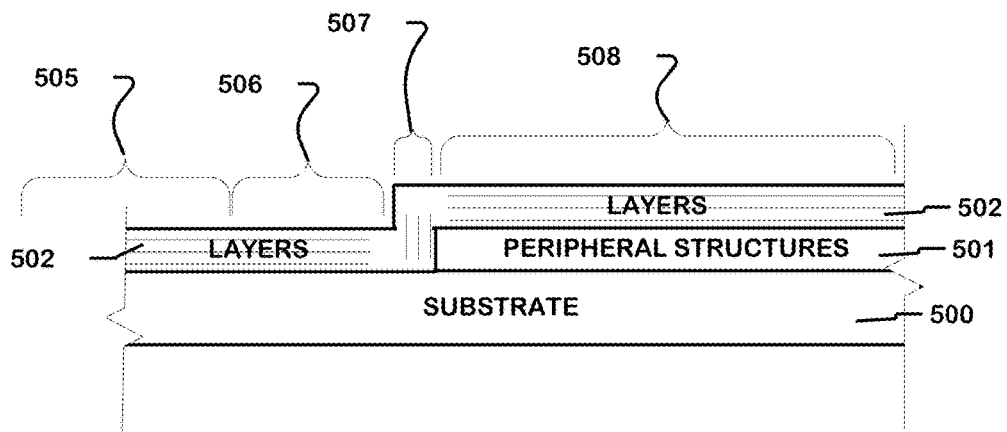
FIGS. 10C and 10D are simplified cross sections of a device at stages of a manufacturing process in which contact structures are formed as described herein.

FIG. 10C is a simplified cross-section of an integrated circuit on which the 3D structures are being formed. The integrated circuit includes a substrate 500, which can be a single crystal silicon wafer at this stage, or other underlying materials on which circuitry as being formed. For the purposes of reference, the integrated circuit has a 3D circuit region 505, a contact region 506, a peripheral edge region 507, and a peripheral region 508.

Peripheral structures 501 are formed over the substrate 500 in the peripheral region 508. Peripheral structures 501 can include transistor gates and conductors which are positioned over corresponding diffusion regions in the substrate 500 used to form peripheral circuitry.

Alternating layers of material used in manufacturing the 3D circuitry are schematically represented by the layers 502 which lie conformably over the surface of the substrate 500 in the 3D circuit region 505, contact region 506, peripheral edge region 507 and in the peripheral region 508.

Figure 10D:
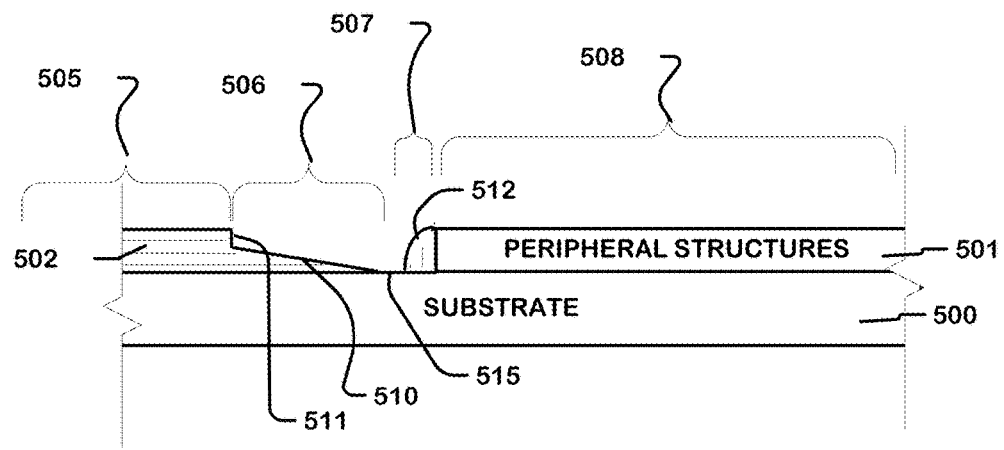

Referring to FIG. 10D, after applying an etch trim and step etch process as described herein, a stairstep structure is formed in the contact region 506. The stairstep structure includes section 510 including landing areas on a subset of the levels, and a sidewall region 511 which results from a step etch, taking a form such as shown in FIG. 10A. In the region 515, substrate 500 maybe exposed. In the peripheral edge region 507, remnants 512 of the layers 502 may be left on a sidewall of peripheral structures 501. As illustrated, material of the layers 502 has been removed from the top surface of the peripheral region by the etching processes used to form the stairstep structures. Of course, additional steps such as planarizing or cleaning steps may be utilized. However, can be understood that it is not necessary to mask the peripheral structures in this approach to formation of the stairstep structures.

Figure 11:
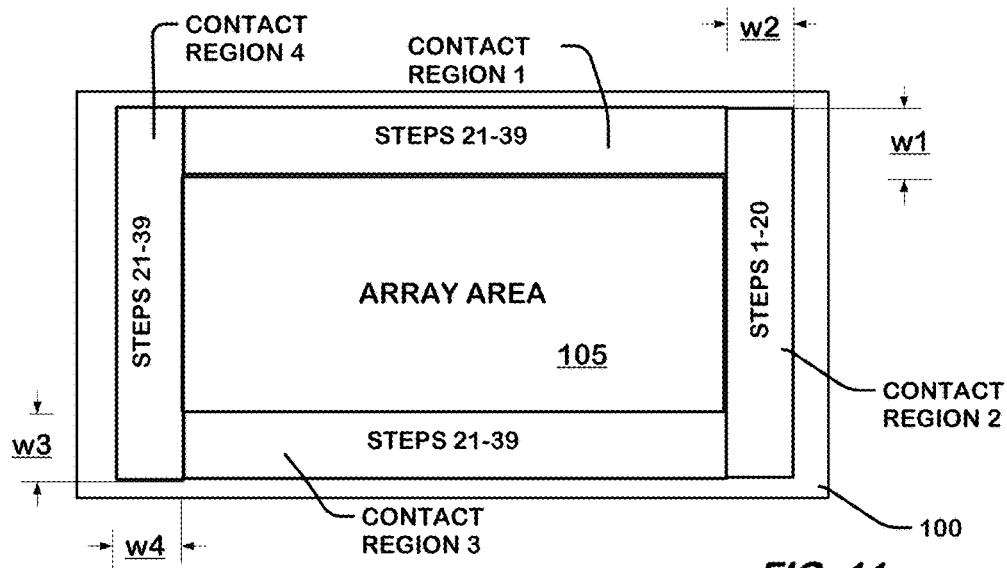
FIG. 11 shows a layout of a multilevel circuitry having contact regions implemented as described herein.

FIG. 11 illustrates in plan view the levels on which steps are formed using the process described with reference to FIG. 8A to FIG. 10B. FIG. 11 shows the array area 105 with contact regions, contact region 1 through contact region 4 disposed around the perimeter of the array area 105. Contact region 1, contact region 3, and contact region 4, have steps for the landing areas on levels 21-39. Contact region 2 has steps for landing areas on levels 1 to 20.

In general, each contact region in the set of contact regions in the structure of FIG. 11 where M is 20 and S1 is 19, include landing areas on circuit elements in up to M levels of the multilevel circuitry, where a first subset of the contact regions includes landing areas on uppermost levels L(i) for i going from W−M+1 (level 20) to W (level 39), and a second subset of the contact regions includes landing areas on levels L(i), for i going from W−M+1−S1 (level 1) to W−S1 (level 19).

The contact regions shown in FIG. 11 have respective widths, w1, w2, w3, w4 in dimensions orthogonal to the perimeter of the array area 105, and sides co-located on the perimeter.

Figure 12:
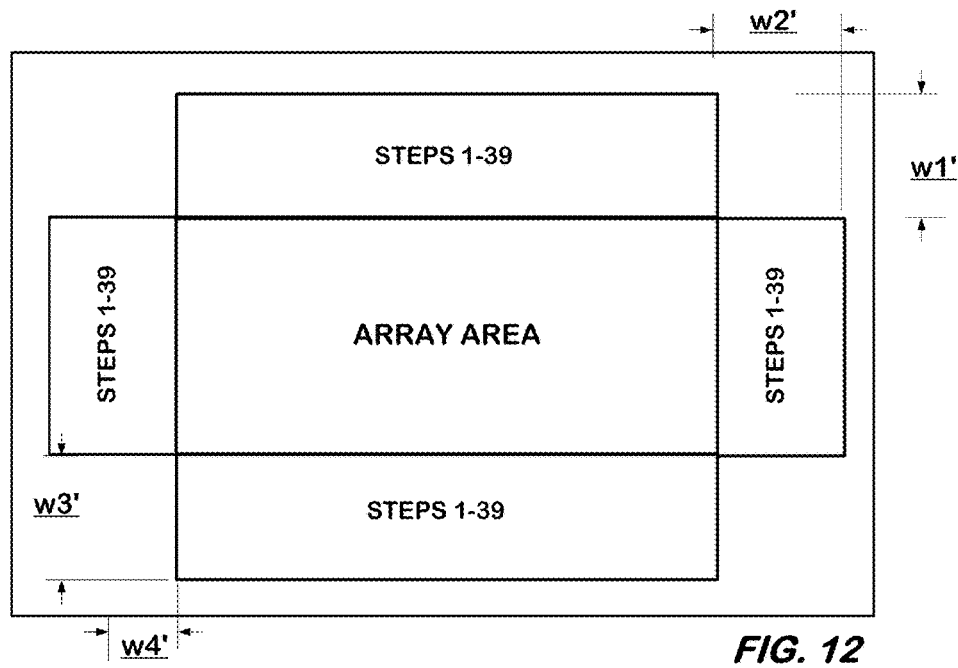
FIG. 12 shows a layout of multilevel circuitry having contact regions implemented according to the prior art.

For comparison, the structure shown in FIG. 12 results from using a prior art technique requiring an etch-trim process to form all 39 steps. In one example, the structure of FIG. 12 can be formed using a six photomask, six etch-trim cycle process. The first etch-trim cycle can create eight steps using seven trim cycles. The second etch-trim cycle can create seven steps using six trim cycles. The third etch-trim cycle can create six steps using five trim cycles. The fourth etch-trim cycle can create six steps using five trim cycles. The fifth etch-trim cycle can create six steps using five trim cycles. The last etch-trim cycle can create six steps using five trim cycles. A smaller number of trim cycles can be applied in the later etch-trim cycles, due to the effects of the topology on the thicknesses of the photoresist masks.

This etch-trim process results in 39 steps sequentially formed in each of the contact regions around the array area. As result of 39 steps sequentially formed in each of the contact regions, the widths w1', w2', w3', w4' of the contact regions are substantially greater than the corresponding widths w1, w2, w3, w4 which result from the present technology.

Using the technology of FIG. 8A to FIG. 10B, the widths w1, w2, w3, w4 can be equal to the width of the M of steps formed using the etch-trim process plus processing margin associated with applying the deep anisotropic etch within essentially the same region. The processing margin can be substantially less than the width of M steps. In addition, the widths w1, w2, w3, w4 can be uniform. Therefore the present technology enables formation of multilevel circuitry with interlevel contacts using a stairstep structure, in less area than required using prior art techniques.

Figure 13A:
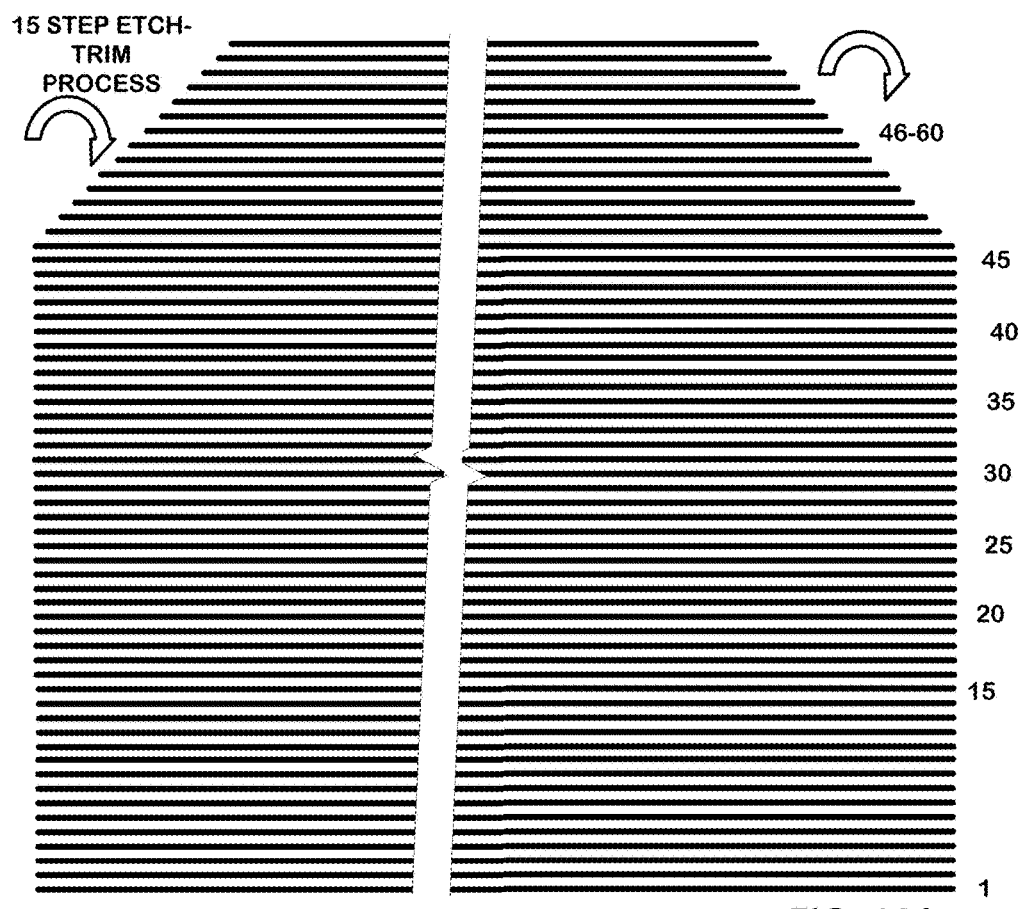
FIG. 13A illustrates in schematic cross-section, multilevel circuitry having 60 levels after applying an etch-trim process as described herein.
Figure 13B:
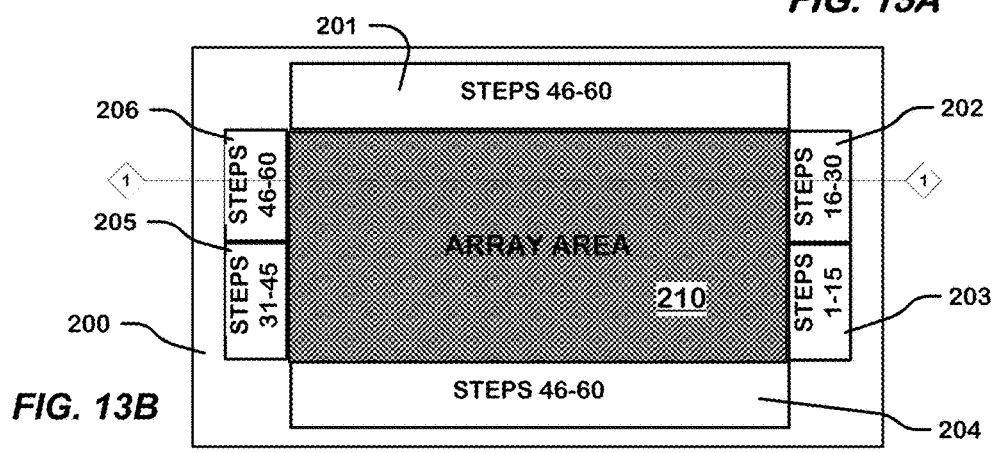
FIG. 13B illustrates a layout arrangement of the multilevel region and contact regions around the perimeter of the multilevel region, and a mask layout used for the etch-trim process of FIG. 13A.

The technology described herein can be extended to larger numbers of levels. For example, FIG. 13A is a schematic cross-section of a 60 level (W=60) multilevel circuitry, showing the results of a 15 step etch-trim process (M=15). FIG. 13B illustrates in plan view, or layout view, the multilevel circuitry 200 having 60 levels. The multilevel circuitry 200 includes an array area 210, and a set of contact regions having six members including contact regions 201-206. The members of the set of contact regions are disposed around the perimeter of the array 210. The sides of the contact regions and the set of contact regions are co-located with the perimeter of the array area 210 is discussed above in connection with FIG. 8B.

In FIG. 13B, the target levels for the steps in each of the contact regions are labeled for the example process. Contact region 201 will have landing areas on levels 46-60 on completion of the process. Contact region 202 will have landing areas on levels 16-30. Contact region 203 will have landing areas on levels 1-15. Contact region 204 will have landing areas on levels 46-60. Contact region 205 point have landing areas on levels 31-45. Contact region 206 will have landing areas on levels 46-60.

In FIG. 13B, the masked area protected from the etch-trim process is illustrated, with all six of the contact regions 201-206 being exposed to the etch-trim process. FIG. 13A is a cross-section taken on the line 1-1 in this example after the etch-trim process, through the contact regions 206 and 202.

After the 15 step etch-trim process (M=15), all the contact regions 201-206 will have steps on levels 46-60. An etch-trim process for 15 steps can require two etch-trim masks and two etch-trim cycles in an example implementation.

In general, the multilevel circuitry of FIGS. 13A and 13B comprises circuit elements disposed in a set of levels including W members, designated levels L(i) for an index "i" going from 1 to W, where W equals 60 in this example. Also, the multilevel circuitry includes a set of contact regions including N members, disposed around the perimeter of the multilevel region (array area 210), where N equals six.

Figure 14A:
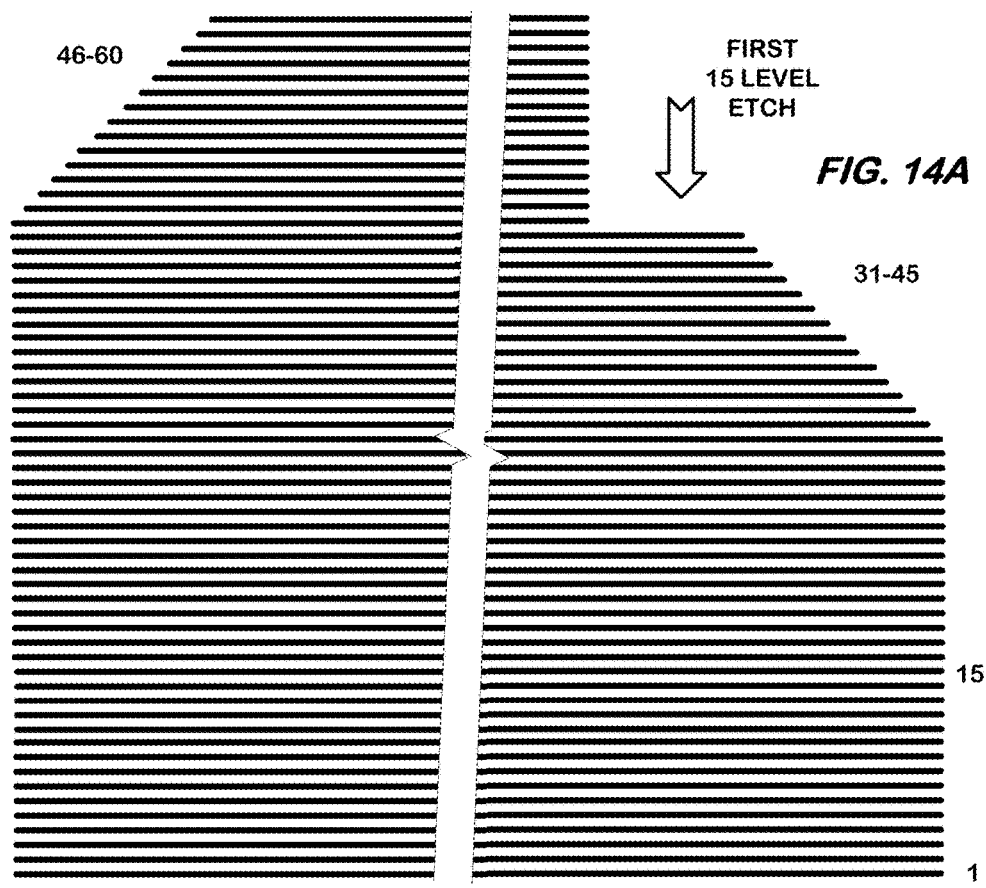
FIG. 14A illustrates in schematic cross-section multilevel circuitry after applying a first step etch process as described herein.

FIG. 14A illustrates the 60 levels after applying a first anisotropic step etch of 15 levels (S1=15), using a step mask exposing a subset of contact regions, including contact regions 202, 203, and 205. Contact regions 201, 204, and 206 remain protected from the first step etch. In general, a deep anisotropic etch of S1 levels is applied, where S1 is equal to 15 in this example.

Figure 14B:
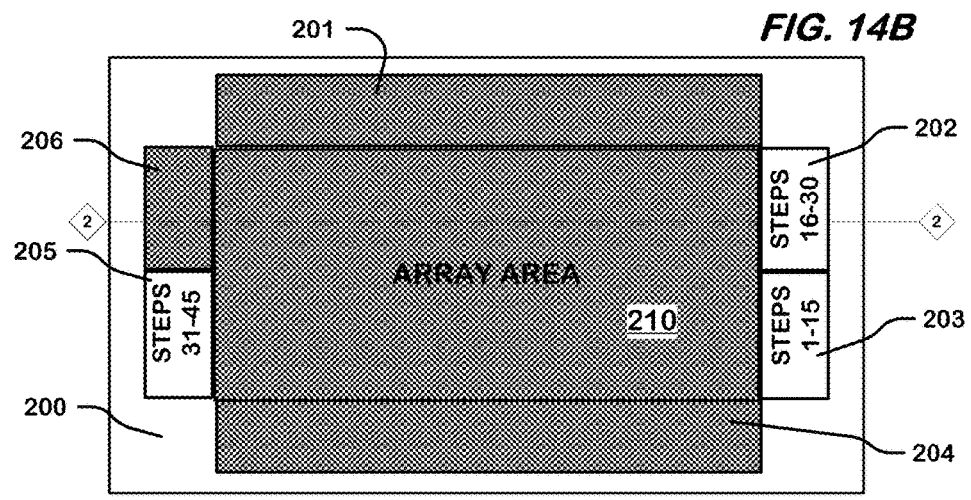
FIG. 14B illustrates a layout arrangement of a mask for the multilevel region and the contact regions used in the first step etch process for FIG. 14A.

In FIG. 14B, the masked area protected from the process is illustrated, with the contact regions 202, 203, and 205 being exposed to the first step etch process. FIG. 14A is a cross-section taken on the line 2-2 through the contact regions 206 and 202 in this example after the first step etch process.

As result of the deep anisotropic etch of S1 levels in a subset of the contact regions, landing areas on circuit elements in S1+M levels are formed, including landing areas on steps in levels 31-45 in the subset of contact regions 202, 203, 205 and levels 46-60 in contact regions 201, 204, 206. S1 must be less than or equal to M to avoid skipping levels.

Figure 15A:
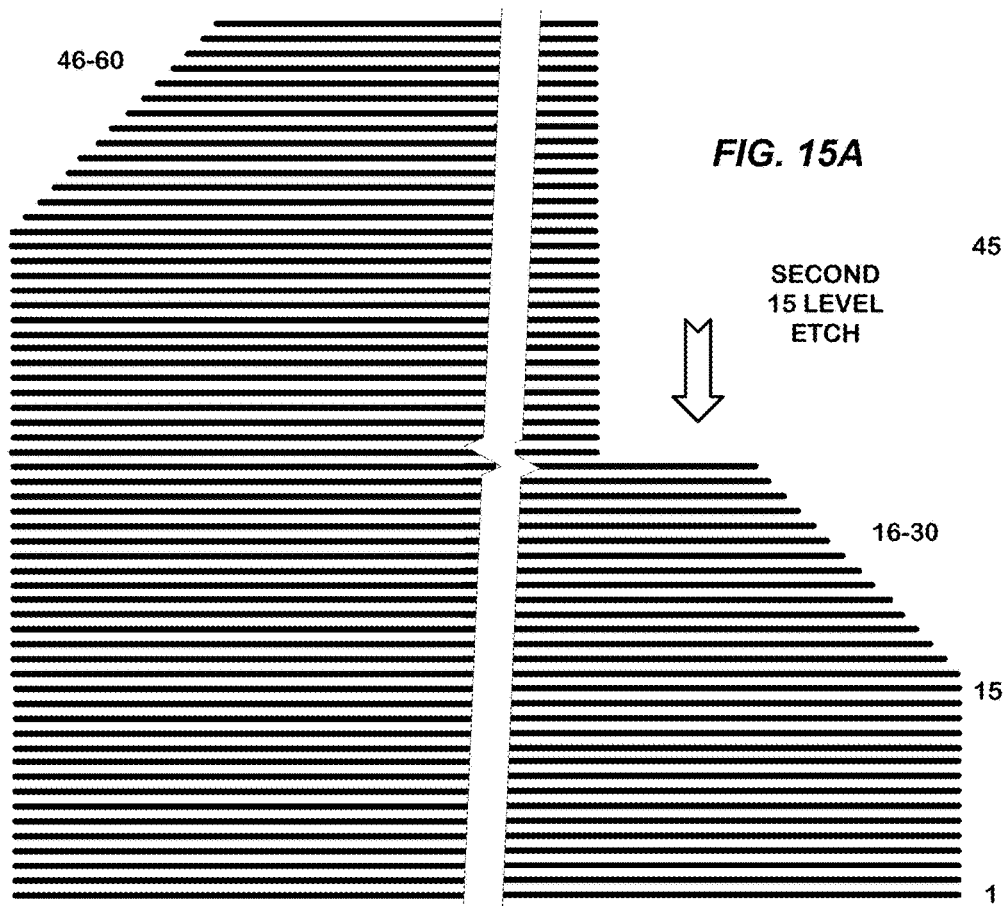
FIG. 15A illustrates in schematic cross-section multilevel circuitry after applying a second step etch process as described herein.

FIG. 15A illustrates the 60 levels after applying a second anisotropic step etch of 15 levels (S2=15) using a step mask exposing a second subset of contact regions, including contact regions 202 and 203. Contact regions 201, 204, 205, and 206 remain protected from the second step etch. In general a deep anisotropic etch of S2 levels is applied, where S2 equals 15 in this example.

Figure 15B:
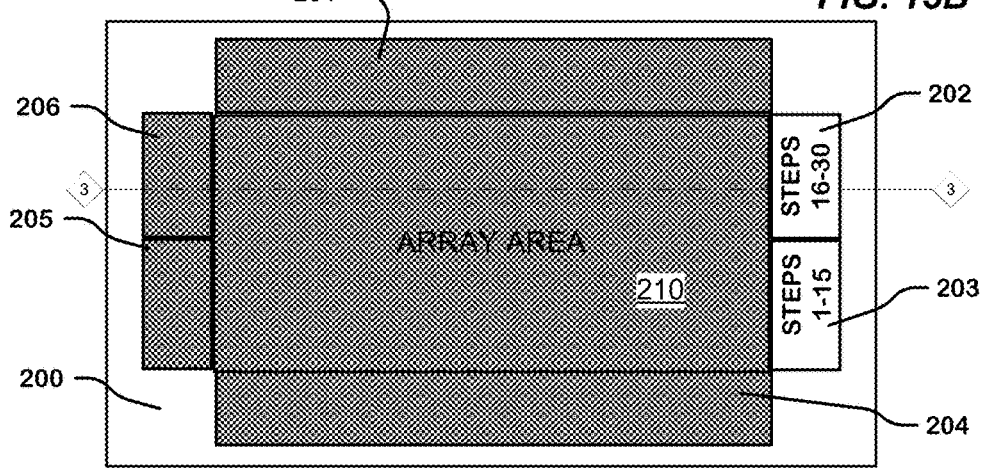
FIG. 15B illustrates a layout arrangement of a mask for the multilevel region and the contact regions used in the second step etch process for FIG. 15A.

In FIG. 15B, the masked area protected from the process is illustrated, with the contact regions 202 and 203 being exposed to the second step etch process. FIG. 15A is a cross-section taken on the line 3-3 through the contact regions 206 and 202, in this example after the second step etch process.

As a result of the deep anisotropic etch of S2 levels in a subset of the contact regions, landing areas on circuit elements in S2+S1+M levels (45 in this example) are formed, including landing areas on steps in levels 16-30 in the second subset of contact regions including contact regions 202 and 203, landing areas on steps in levels 31-45 in contact region 205 (which was also a member of the first subset of contact regions), and landing areas on steps in levels 46-60 in contact regions 201, 204 and 206.

Figure 16A:
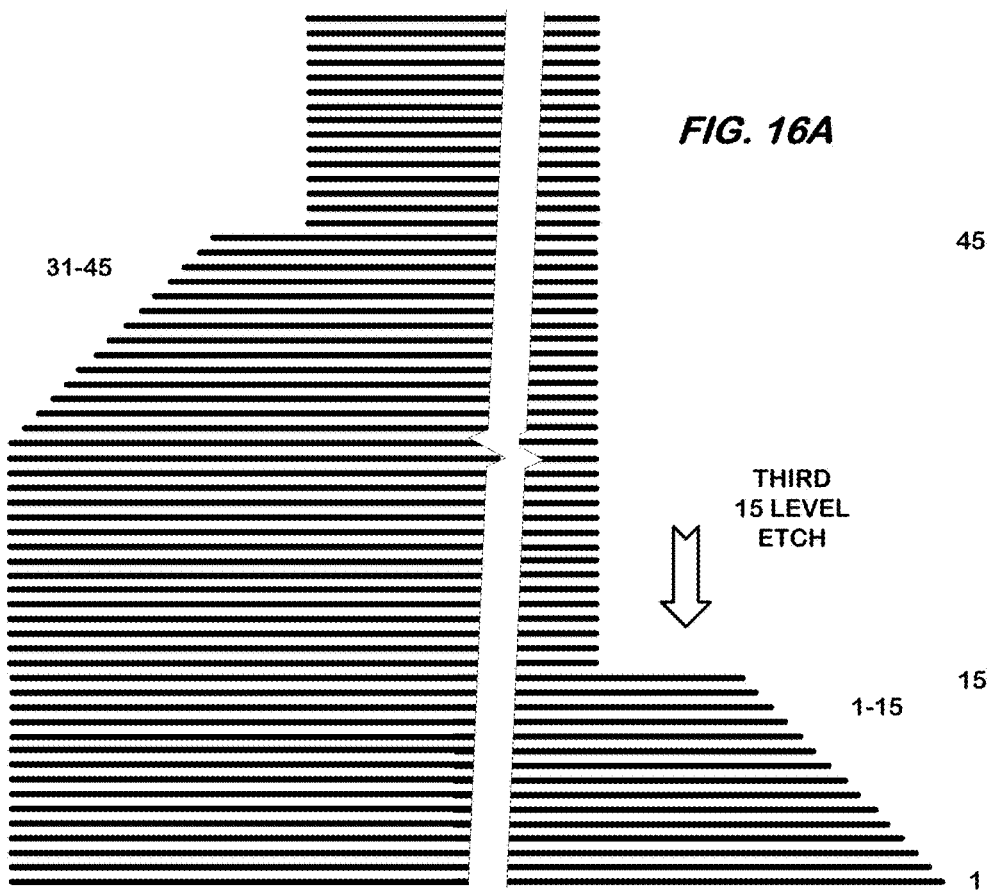
FIG. 16A illustrates in schematic cross-section multilevel circuitry after applying a third step etch process as described herein.

FIG. 16A illustrates the 60 levels after applying a third anisotropic etch of 15 levels (S3=15) using a step mask exposing a third subset of contact regions, including contact region 203. Contact regions 201, 202, 204, 206, and 206 remain protected from the third step etch. In general a deep anisotropic etch of S3 levels is applied, where S3 is equal to 15 in this example.

Figure 16B:
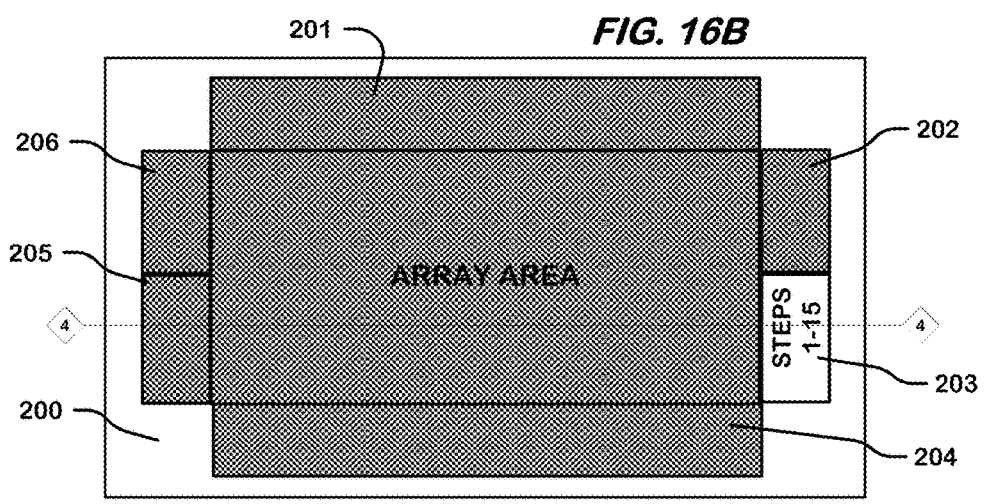
FIG. 16B illustrates a layout arrangement of a mask for the multilevel region and the contact regions used in the third step etch process for FIG. 16A.

In FIG. 16B, the masked area protected from the process is illustrated, with the contact region 203, being exposed to the third step etch process. FIG. 16A is a cross-section taken on the line 4-4 through the contact regions 205 and 203, in this example after the third step etch process.

As a result of the deep anisotropic etch of S3 levels in a subset of the contact regions, landing areas on circuit elements in S3+S2+S1+M levels (60 in this example) are formed, including landing areas on steps in levels 1-15 in contact region 203, landing areas on steps in levels 16-30 in contact region 202, landing areas on steps in levels 31-45 in contact region 205, and landing areas on steps in levels 46-60 in the contact regions 201, 204 and 206.

In general, each contact region in the set of contact regions in the structure of FIG. 16A where M is 15, S1 is 15, S2 is 15 and S3 is 15, includes landing areas on circuit elements in up to M levels of the multilevel circuitry, where a first subset of the contact regions includes landing areas on uppermost levels L(i) for i going from W−M+1 (level 46) to W (level 60), and a second subset of the contact regions includes landing areas on levels L(i), for i going from W−M+1−S1 (level 31) to W−S1 (level 45). A third subset of the contact regions includes landing areas on levels L(i), for i going from W−M+1−S1−S2 (level 16) to W−S1−S2 (level 30). A fourth subset of the contact regions includes landing areas on levels L(i), for i going from W−M+1−S1−S2−S3 (level 1) to W−S1−S2−S3 (level 15).

The widths of the contact regions as discussed above are equal to the width of M steps formed using the etch-trim process, plus a process margin, where the process margin can be much less than the width of M steps. Therefore, the area on the multilevel circuitry required for formation of the interlevel contacts is much less than required using a 60 level stairstep.

Landing areas for 60 levels are formed using the process of FIGS. 13A to 16B using two masks for the etch-trim process, and three masks for the three-step processes. In contrast, using an etch-trim process for 60 levels, given the limitation on the number of levels that can be formed using a single mask, can require as many as 10 etch-trim cycles, with 10 photoresist masks trimmed an average of six times. Thus, the technique described herein uses a smaller number of masks, and consumes much less area than prior art techniques required for forming sequential stairstep contacts to large numbers of levels.

FIGS. 13B, 14B, 15B and 16B illustrate a mask set comprising a plurality of photolithographic mask reticles used to define etch-trim and step etch masks used in etching the multilevel region, the perimeter of the multilevel region over a transition region in the multilevel circuitry, and the contact regions located on the perimeter of the multilevel region. The layout of the mask sets can be understood with reference to these figures, and the description set forth above. The mask reticles can comprise optical glass with patterns formed thereon using chrome, as one example. Thus, one aspect of the technology described herein includes a set of mask reticles configured for use in a combination of etch-trim cycles and anisotropic step etch cycles as described herein.

Figure 17:
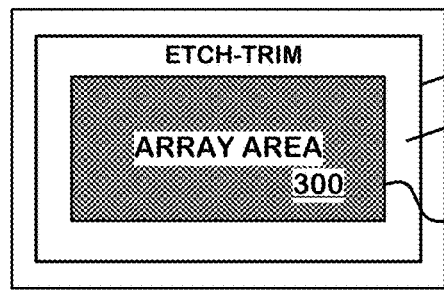
FIG. 17 illustrates a mask having an open etch region around the entire perimeter of a multilevel region, which can result from an etch-trim process.

The arrangement of the levels having landing areas in any given contact region can be configured as needed for particular implementation, so that the masks used in the processes can have a variety of shapes to implement any desired arrangement, examples of which are described with reference to FIGS. 17-2. FIG. 17 illustrates an etch mask which results from an etch trim process, leaving an open region 301 having M steps around the entire perimeter of an array area 300. The mask used to form the etch trim mask of FIG. 17 can define an outside perimeter 301-1 of the region 301, which can be used to pattern a mask that covers all the contact regions, except an outside landing area in some examples, and the array area 300 in an etch-trim process. The perimeter 301-2 can define the perimeter of the 3D circuitry for the purposes of this description, and is co-located on that perimeter.

Figure 18:
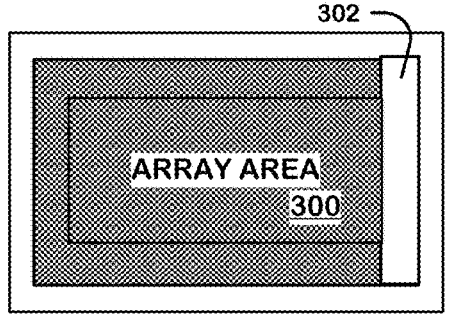
FIG. 18 illustrates a mask having an open etch region on one side of the perimeter of a multilevel region, suitable for use as a step etch mask.

FIG. 18 illustrates a mask having an open etch region 302 on only one side of the array area 300, which can be used as a mask for a step etch process.

Figure 19:
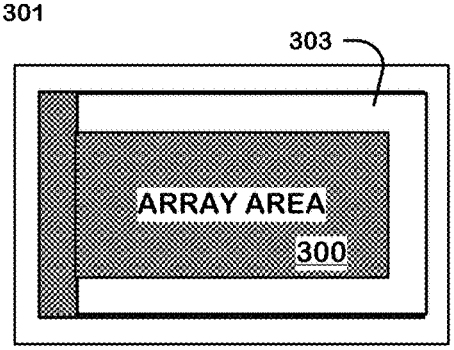
FIG. 19 illustrates a mask having an open etch area on three sides of the perimeter of a multilevel region, suitable for use as a step etch mask.

FIG. 19 illustrates a mask having an open etch region 303 on three sides of an array area, which can be used as a mask for a step etch process.

Figure 20:
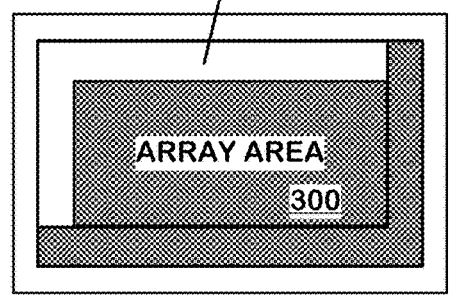
FIG. 20 illustrates a mask having an open etch area on two sides of the perimeter of the multilevel region, suitable for use as a step etch mask.

FIG. 20 illustrates a mask having an open etch region 304 on two sides of an array area, which can be used as a mask for a step etch process.

Figure 21:
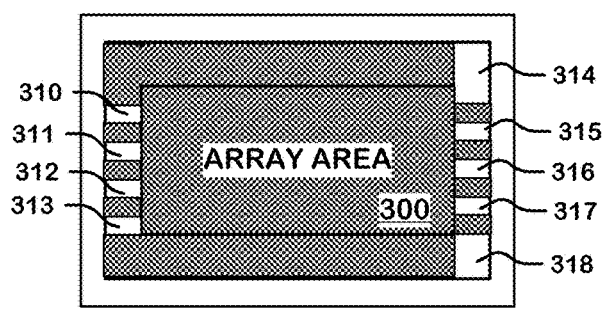
FIG. 21 illustrates a mask having a number of open etch regions arranged around the perimeter of a multilevel region, suitable for use as a step etch mask.

FIG. 21 illustrates a mask having a number of open etch regions 310-318 arrayed on two sides of the array area 300, which can be used as a mask for step etch process.

As can be seen, the combination of masks applied can take on a variety of shapes giving flexibility in the arrangement of the levels having landing areas of the various contact regions. FIG. 13B shows one arrangement of contact regions implementing a 60-level interlevel contact structure, where each contact region around the perimeter of the array area has 15 steps.

Figure 22:
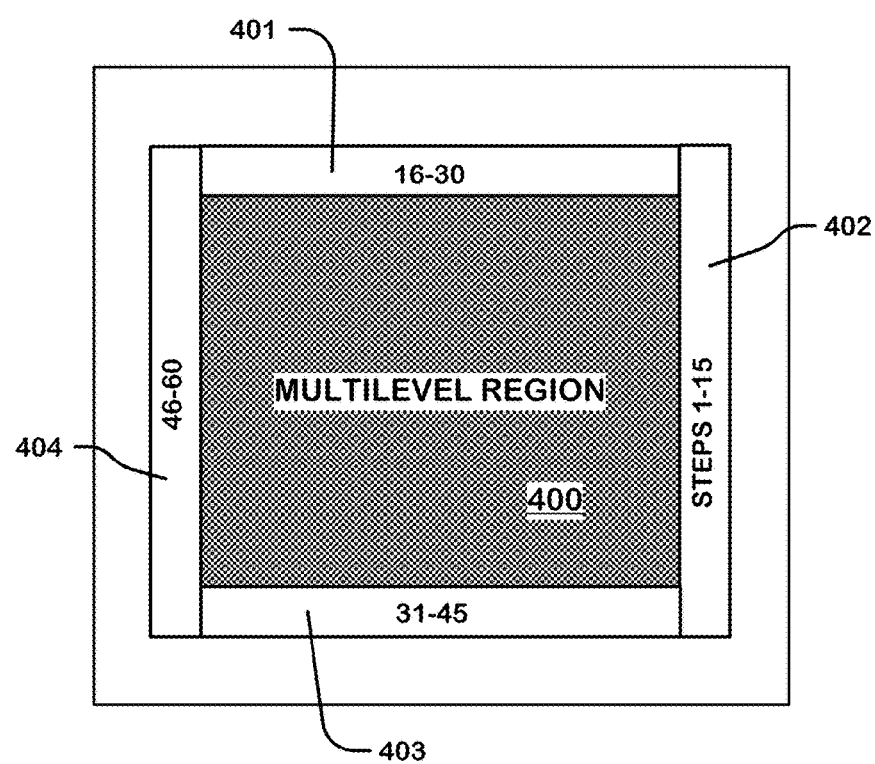
FIG. 22 shows a first example arrangement of 60-level multilevel circuitry including interlevel connectors implemented as described herein.
Figure 23:
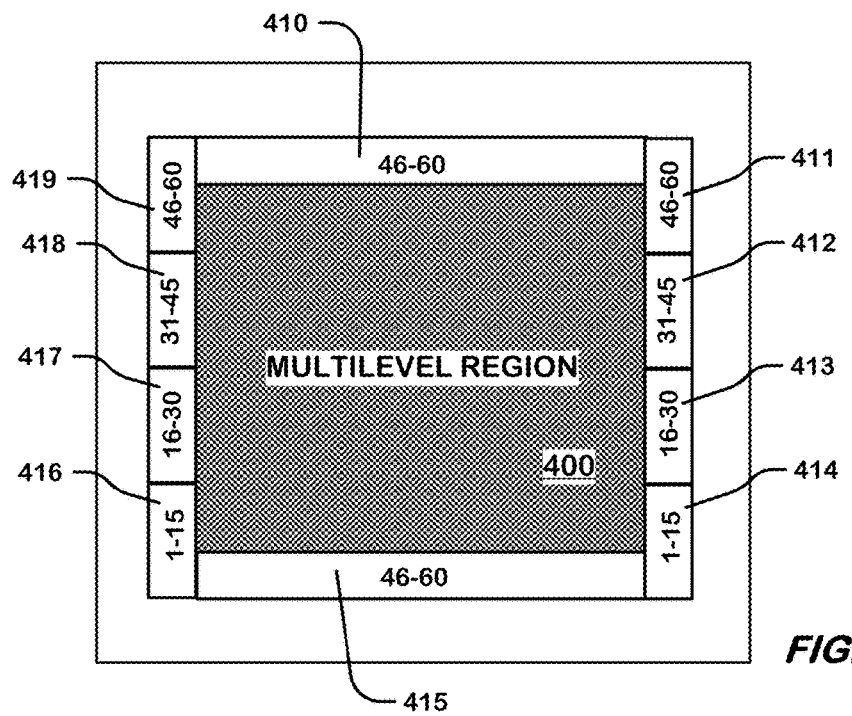
FIG. 23 shows a second example arrangement of 60-level multilevel circuitry including interlevel connectors implemented as described herein.
Figure 24:
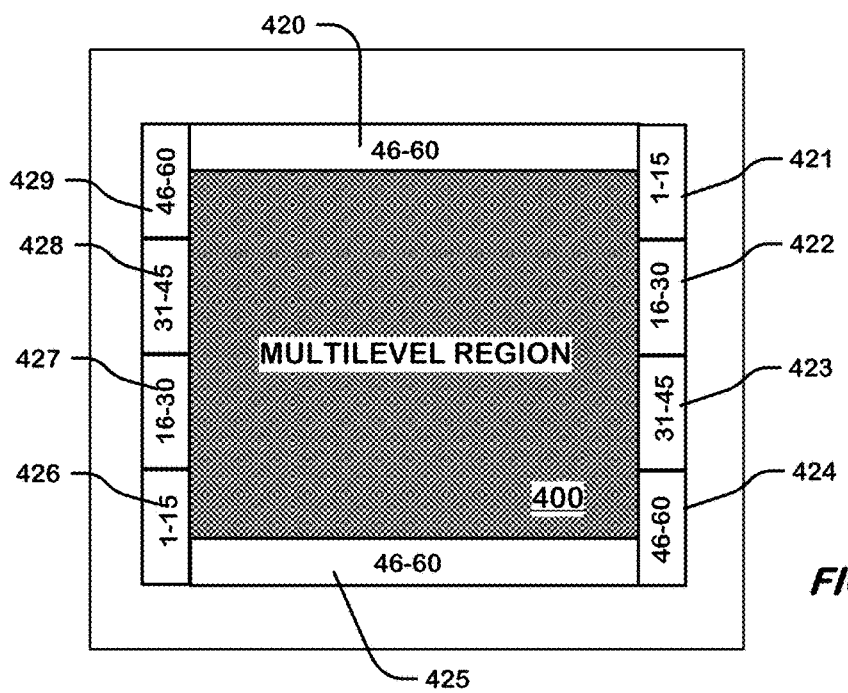
FIG. 24 shows a third example arrangement of 60-level multilevel circuitry including interlevel connectors implemented as described herein.

Other arrangements can be implemented as illustrated in FIGS. 22-24 using a variety of masks shapes and process sequences.

FIG. 22 illustrates contact regions 401-404 arranged around the perimeter of a multilevel region 400 with steps on 60 levels. Contact region 401 has steps on levels 16-30, contact region 402 has steps on levels 1-15, contact region 403 has steps on levels 31-45, and contact region 404 has steps on levels 46-60.

FIG. 23 illustrates contact regions 410-419 arranged around the perimeter of a multilevel region 400 with steps on 60 levels. Contact region 410 has steps on levels 46-60. Contact region 411 has steps on levels 46-60. Contact region 412 has steps on levels 31-45. Contact region 413 has steps on region 16-30. Contact region 414 has steps on levels 1-15. Contact region 415 has steps on levels 46-60. Contact region 416, opposite contact region 414, has steps on levels 1-15. Contact region 417, opposite contact region 413, has steps on levels 16-30. Contact region 418, opposite contact region 412, has steps on levels 31-45. Contact region 419, opposite contact region 411, has steps on levels 46-60.

FIG. 24 illustrates contact regions 420-429 arranged around the perimeter of a multilevel region with steps on 60 levels which can be compared to the arrangement of FIG. 23. In FIG. 24, contact region 420 has steps on levels 46-60. Contact region 421 has steps on levels 1-15. Contact region four in 22 has steps on levels 16-30. Contact region 423 has steps on levels 31-45. Contact region 424 has steps on levels 46-60. Contact region 425 has steps on levels 46-60. Contact region 426 has steps on levels 1-15. Contact region 427 has steps on levels 16-30. Contact region 428 has steps on levels 31-45. Contact region 429 has steps on levels 46-60.

Thus, as represented by the arrangements of FIGS. 22-24, a wide variety of configurations can be implemented using the technology described herein.

Figure 25:
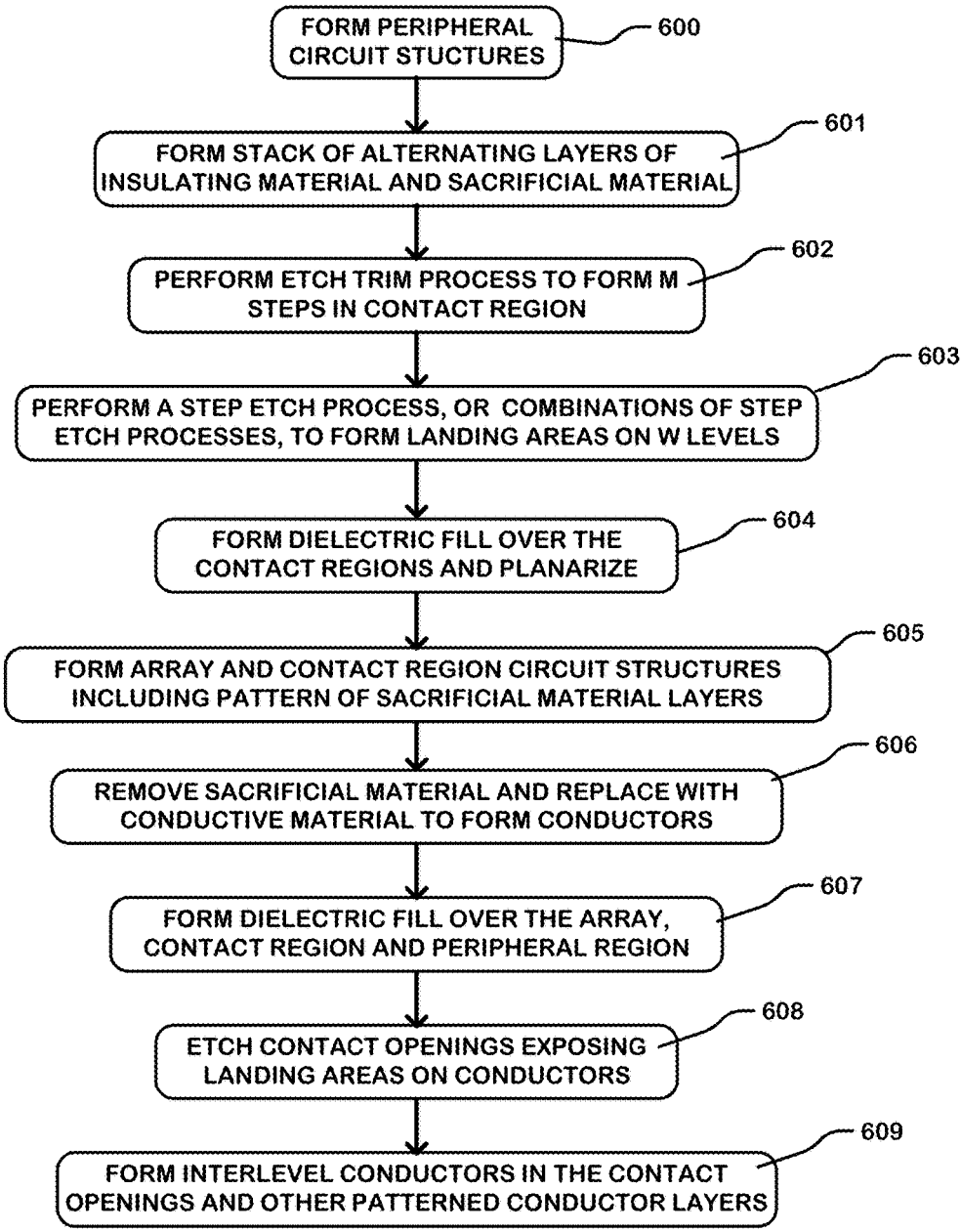
FIG. 25 is flowchart illustrating a manufacturing method for formation of stairstep contacts as described herein

FIG. 25 is a simplified flowchart of a representative manufacturing process using etch trim and step etch processes as described herein.

In this example, the process begins at a stage of manufacturing in which the peripheral circuit structures are formed (600). The structures can include isolation trenches, substrate implants, gate dielectrics, gate conductors and so no. A layer of insulating material or other protective layer can be formed and patterned to cover the peripheral circuit structures and expose the array area in which 3D circuitry is to be formed and the contact regions.

Next, the stack of alternating layers of insulating material and sacrificial material is formed (601) for the purposes of forming W levels in the 3D circuitry. The insulating material can comprise silicon dioxide and the sacrificial material can comprise silicon nitride. Such materials are chosen for their etch chemistry, and other suitable materials can be utilized. In this example, the 3D circuitry and contact region are manufactured using a metal replacement technique. In other examples, a sacrificial material is not used; and the stack can be formed of insulating material and conductor material, such as doped semiconductors or metals as described above.

After formation of the stack of alternating layers, the stairstep structure is then made, by performing an etch trim process to form M steps in the contact regions (602). As described above, next, a step etch process, or a combination of step etch processes, and is performed to form landing areas of the sacrificial material on the W levels of the 3D circuitry on which contact is desired (603). Then a dielectric fill layer is formed over the structure and planarized in this example process flow (604).

Using patterning processes and etch processes, the stack is patterned to define array and contact region structures foe the 3D circuitry (605). This includes defining patterns in the sacrificial layers. Thus, in the contact region, trenches can be formed in the stack to form stacks of strips of the sacrificial material between layers of insulating material. The strips are patterned so that they have the required dimensions for landing areas, and are narrow enough that the sacrificial material can be sufficiently removed and the replacement process. Also, the strips are pattern to provide connection to corresponding structures in the 3D circuitry, such as to word line structures or bit line structures.

After patterning the stack, the sacrificial material can be removed and replaced by a conductive material to form conductors (606). For example, the sacrificial material can be removed using a selective wet etch for example, which removes silicon nitride without removing the silicon dioxide from the stack of layers. A conductive material such as tungsten or other metal which can be deposited within the voids left by removal of the sacrificial material is deposited using a chemical vapor deposition process or other similar process.

After the replacement of the sacrificial material with a conductive material to form conductors, a dielectric fill such as a silicon dioxide or other interlayer dielectric materials, can be formed over the contact region (607). A patterned etch is then used to form contact openings exposing landing areas on the conductors (608). Next, interlevel conductors are formed in the contact openings using for example a metal such as tungsten, and other patterned conductor layers are formed for the purposes of interconnecting the 3D circuitry with the peripheral circuitry, and other necessary connections (609).

A method for manufacturing 3D circuitry is described that comprises forming multilevel circuitry having circuit elements disposed in a set of levels including W members, the multilevel circuitry including a multilevel region having a perimeter and a set of contact regions including N members, the contact regions in the set of contact regions being disposed on the perimeter of the multilevel region. The process includes performing an etch-trim process to form M steps in each of the N members of the set of contact regions, where the etch-trim process includes at least one etch-trim cycle and the etch-trim cycle includes forming an etch-trim mask exposing portions of the set of contact regions and covering the multilevel region, and iteratively etching one level of the set of levels using the etch-trim mask, and then trimming the etch-trim mask in the set of contact regions and etching one more level using the trimmed etch-trim mask for a number of iterations. Also, the process includes forming a step mask exposing a subset of the set of contact regions and covering the multilevel region and all other contact regions in the set of contact regions, and etching S1 levels using the step mask, wherein the subset includes less than N members of the set of contact regions. As a result of the etch-trim process and the step etch, landing areas on circuit elements in S1+M levels in the set of levels are formed in the set of contact regions. If S1+M is equal to W, the process is finished. Also landing areas on no more than M levels are formed in one contact region in the set of contact regions.

The method can further comprise forming a second step mask exposing a second subset of the set of contact regions and covering the multilevel region and all other contact regions in the set of contact regions, and etching S2 levels using the second step mask, wherein the second subset and the first mentioned subset are not equal sets, and intersect with at least one of the N members of the set of contact regions. As a result of a second step etch, landing areas on circuit elements in S1+S2+M levels in the set of levels are formed in the set of contact regions. If S1+S2+M is equal to W, the process is finished.

The method can further comprise forming a third step mask exposing a third subset of the set of contact regions and covering the multilevel region and all other contact regions in the set of contact regions, and etching S3 levels using the third step mask, wherein the third subset is not an equal set with the first mentioned subset and is not an equal set with the second subset, and the third subset includes a member of the set of contact regions that is in both the first mentioned and the second subsets. As a result of the third step etch, landing areas on circuit elements in S1+S2+S3+M levels in the set of levels are formed in the set of contact regions. If S1+S2+S3+M is equal to W, the process is finished, as is true in this example.

The method can further comprise after said landing areas are formed, applying a dielectric fill over the landing areas; creating contact openings down to the landing areas through the dielectric fill; and forming interlevel connectors in the contact openings.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. The disclosures of any and all patents, patent applications and printed publications referred to above are incorporated by reference.

What is claimed is:

1. A 3D circuit, comprising:
   multilevel circuitry having circuit elements disposed in a set of levels including W levels L(i) for i going from 1 to W, the multilevel circuitry including a multilevel region having a perimeter having a plurality of sides, and a set of contact regions including N members, the contact regions in the set of contact regions being disposed on different sides of the plurality of sides of the perimeter of the multilevel region; and
   each contact region in the set of contact regions including landing areas on circuit elements in up to M levels of the multilevel circuitry, where M is an integer less than W, where a first subset of the contact regions disposed on a first side of the perimeter includes landing areas on at most M levels in uppermost levels L(i) for i going from W−M+1 to W, and a second subset of the contact regions disposed on a second side of the perimeter, includes landing areas on at most M levels in levels L(i), for i going from W−M+1−S1 to W−S1, where S1 is a non-zero integer number of levels less than W.

2. The 3D circuit of claim 1, wherein a third subset of the contact regions including at least one disposed on a third side of the perimeter includes landing areas on levels L(i), for i going from W−M+1−S1−S2 to W−S1−S2, where S1 and S2 are a non-zero integer numbers of levels less than W.

3. The 3D circuit of claim 1, wherein a fourth subset of the contact regions including at least one disposed on a fourth side of the perimeter includes landing areas on levels L(i), for i going from W−M+1−S1−S2−S3 to W−S1−S2−S3, where S1, S2 and S3 are non-zero integer numbers of levels less than W.

4. The 3D circuit of claim 1, wherein in the contact regions in the set of contact regions, the circuit elements in the levels comprise conductors in a layer of conductive material and a layer of insulating material, further comprising:
   a dielectric fill over the landing areas;
   contact openings down to the landing areas through the dielectric fill; and
   interlevel connectors in the contact openings.

5. The 3D circuit of claim 1, wherein the landing areas step sequentially to lower levels in a direction orthogonal to the perimeter in each of contact regions in the set of contact regions.

6. The 3D circuit of claim 1, wherein the members of the set of contact regions have a uniform width dimension orthogonal to the corresponding sides.

7. The 3D circuit of claim 6, wherein the up to M landing areas in the contact regions have in combination a stairstep width in the dimension orthogonal to the corresponding sides, and the uniform width of the contact regions in the set of contact regions is equal to said stairstep width plus a process margin, the process margin being less than said stairstep width.

8. The 3D circuit of claim 1, wherein the multilevel circuitry comprises a 3D memory array.

9. The 3D circuit of claim 1, wherein the multilevel region includes a transition region including only conductors between circuit elements in the multilevel circuitry and the contact regions, and the perimeter is in the transition region.

10. The 3D circuit of claim 1, wherein the multilevel region includes a transition region including only conductors between circuit elements in the multilevel circuitry and the contact regions, and the perimeter is in the transition region and comprises four sides, and contact regions in the set of contact regions have sides disposed on the perimeter on each of said four sides.

* * * * *